(12) United States Patent
Ikeda et al.

(10) Patent No.: US 11,517,943 B2
(45) Date of Patent: Dec. 6, 2022

(54) CLEANING METHOD AND SUBSTRATE PROCESSING APPARATUS

(71) Applicant: Tokyo Electron Limited, Tokyo (JP)

(72) Inventors: Kyoko Ikeda, Yamanashi (JP); Kazuya Dobashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/258,431

(22) PCT Filed: Jul. 1, 2019

(86) PCT No.: PCT/JP2019/026151
§ 371 (c)(1),
(2) Date: Jan. 6, 2021

(87) PCT Pub. No.: WO2020/013014
PCT Pub. Date: Jan. 16, 2020

(65) Prior Publication Data
US 2021/0268556 A1    Sep. 2, 2021

(30) Foreign Application Priority Data
Jul. 12, 2018  (JP) .............................. JP2018-132558

(51) Int. Cl.
*B08B 7/02* (2006.01)
*B08B 5/02* (2006.01)
*B08B 13/00* (2006.01)
*C23C 16/44* (2006.01)

(52) U.S. Cl.
CPC .............. *B08B 7/026* (2013.01); *B08B 5/023* (2013.01); *B08B 13/00* (2013.01); *C23C 16/4407* (2013.01)

(58) Field of Classification Search
CPC ......... B08B 7/026; B08B 5/023; B08B 13/00; G23C 16/4407
See application file for complete search history.

(56) References Cited

U.S. PATENT DOCUMENTS

| 2005/0082000 A1* | 4/2005 | Moriya | H01L 21/67028 156/345.28 |
| 2007/0131253 A1* | 6/2007 | Nakamura | H01L 21/6831 134/22.1 |
| 2008/0154410 A1* | 6/2008 | Nakamura | H01L 21/02041 700/95 |

(Continued)

FOREIGN PATENT DOCUMENTS

| JP | 2007-165648 A | 6/2007 |
| JP | 2008-053661 A | 3/2008 |

(Continued)

OTHER PUBLICATIONS

Wikipedia, Definition of "Vacuum", (Year: 2021).*
International Search Report dated Sep. 24, 2019 for WO 2020/013014 A1 (4 pages).

*Primary Examiner* — Sharidan Carrillo
(74) *Attorney, Agent, or Firm* — Venjuris, P.C.

(57) ABSTRACT

A cleaning method that removes contaminants adhering to a stage in a chamber, includes: setting a pressure in a chamber to a predetermined vacuum pressure; supplying a first gas that forms a shock wave toward the stage; and supplying a second gas that does not form the shock wave toward the stage.

16 Claims, 15 Drawing Sheets

(56) References Cited

U.S. PATENT DOCUMENTS

| | | | | |
|---|---|---|---|---|
| 2010/0122710 A1* | 5/2010 | Kato | ................ | H01L 21/68771 |
| | | | | 134/1 |
| 2010/0227046 A1* | 9/2010 | Kato | ................ | H01L 21/67196 |
| | | | | 118/712 |
| 2016/0083841 A1* | 3/2016 | Honma | ............. | C23C 16/45551 |
| | | | | 118/728 |
| 2018/0179627 A1* | 6/2018 | Yamasaki | ......... | H01L 21/68792 |
| 2019/0055648 A1* | 2/2019 | Nishimura | .......... | C23C 16/4557 |
| 2019/0360092 A1* | 11/2019 | Sato | ................. | H01J 37/32449 |
| 2020/0141001 A1* | 5/2020 | Kato | ................ | H01J 37/32715 |

FOREIGN PATENT DOCUMENTS

| | | | | |
|---|---|---|---|---|
| JP | 2008-159787 A | 7/2008 | | |
| JP | 2009-302185 A | 12/2009 | | |
| JP | 2011-135003 A | 7/2011 | | |
| JP | 2015-026745 A | 2/2015 | | |
| JP | 2015-041646 A | 3/2015 | | |
| JP | 2018-093121 A | 6/2018 | | |
| WO | WO-02053300 A1 * | 7/2002 | ....... | H01L 21/67028 |

* cited by examiner

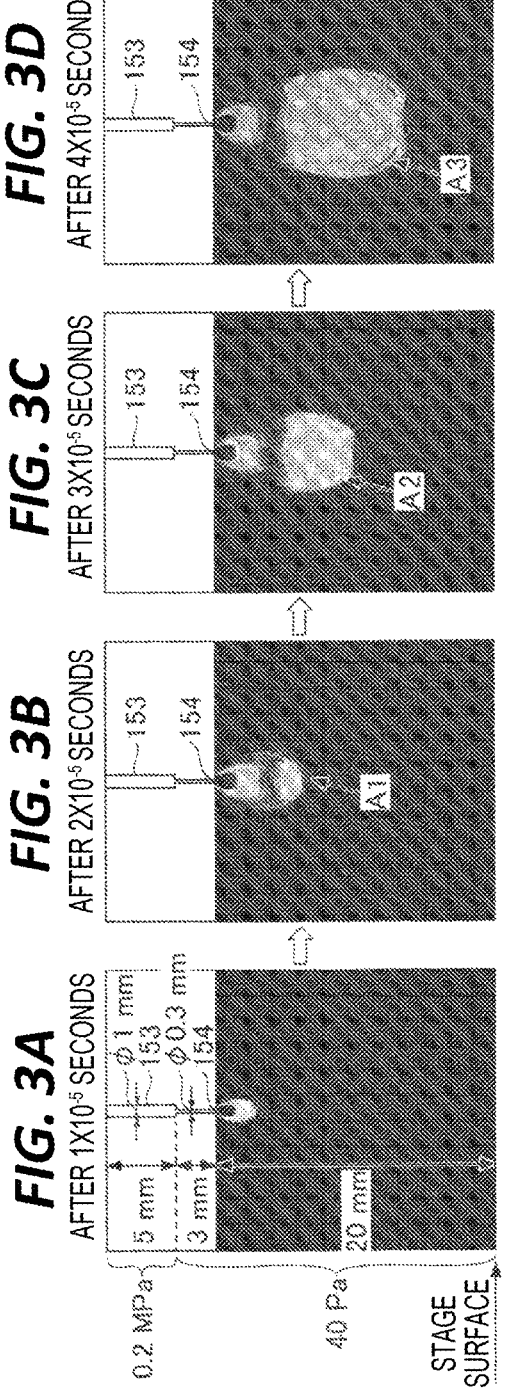
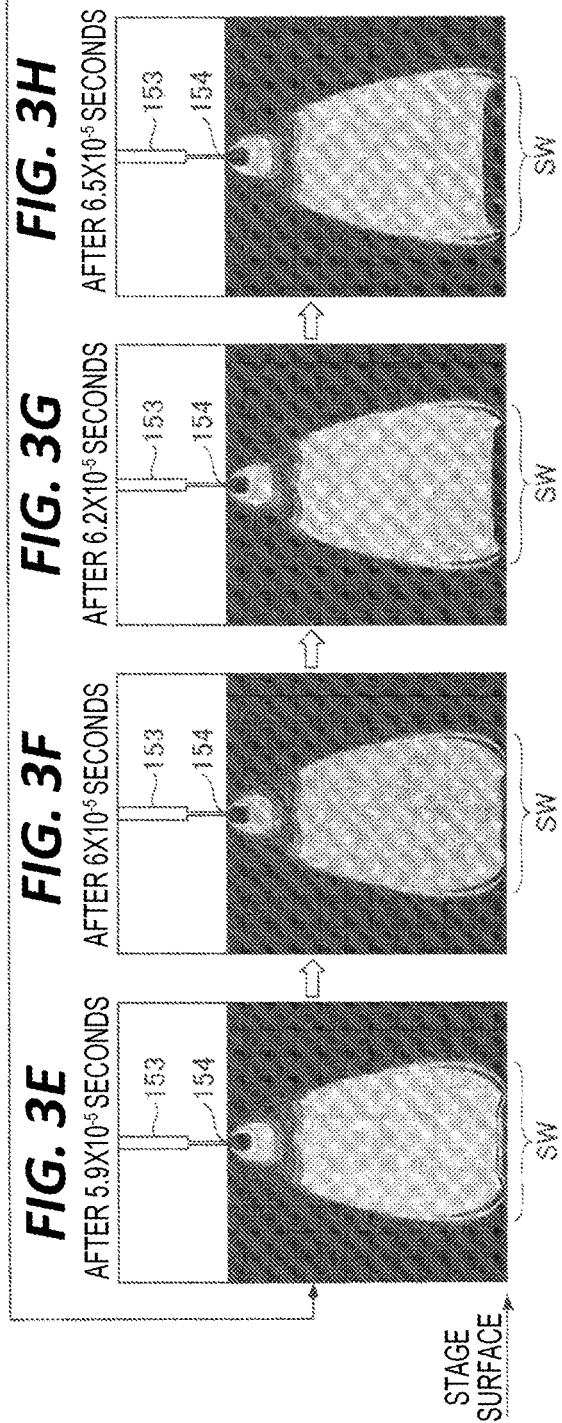

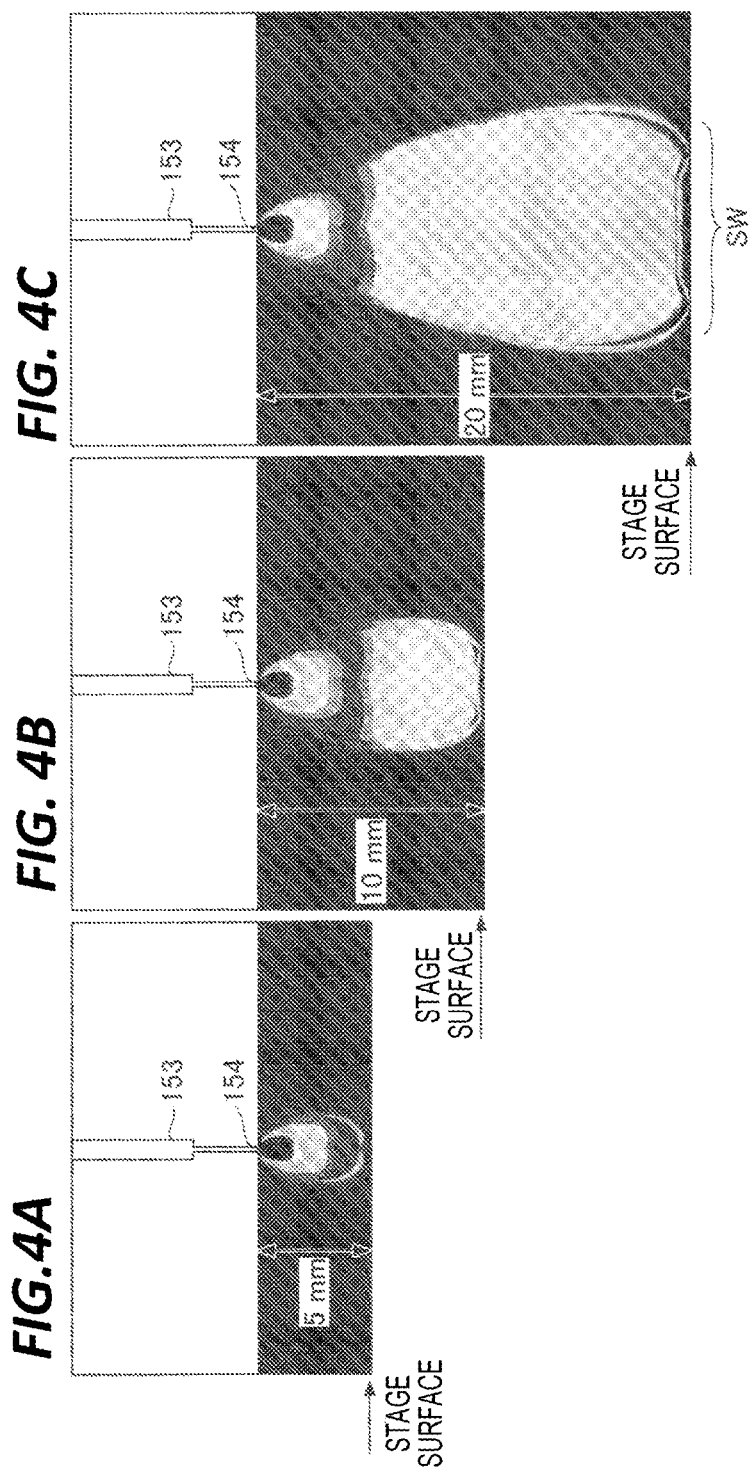

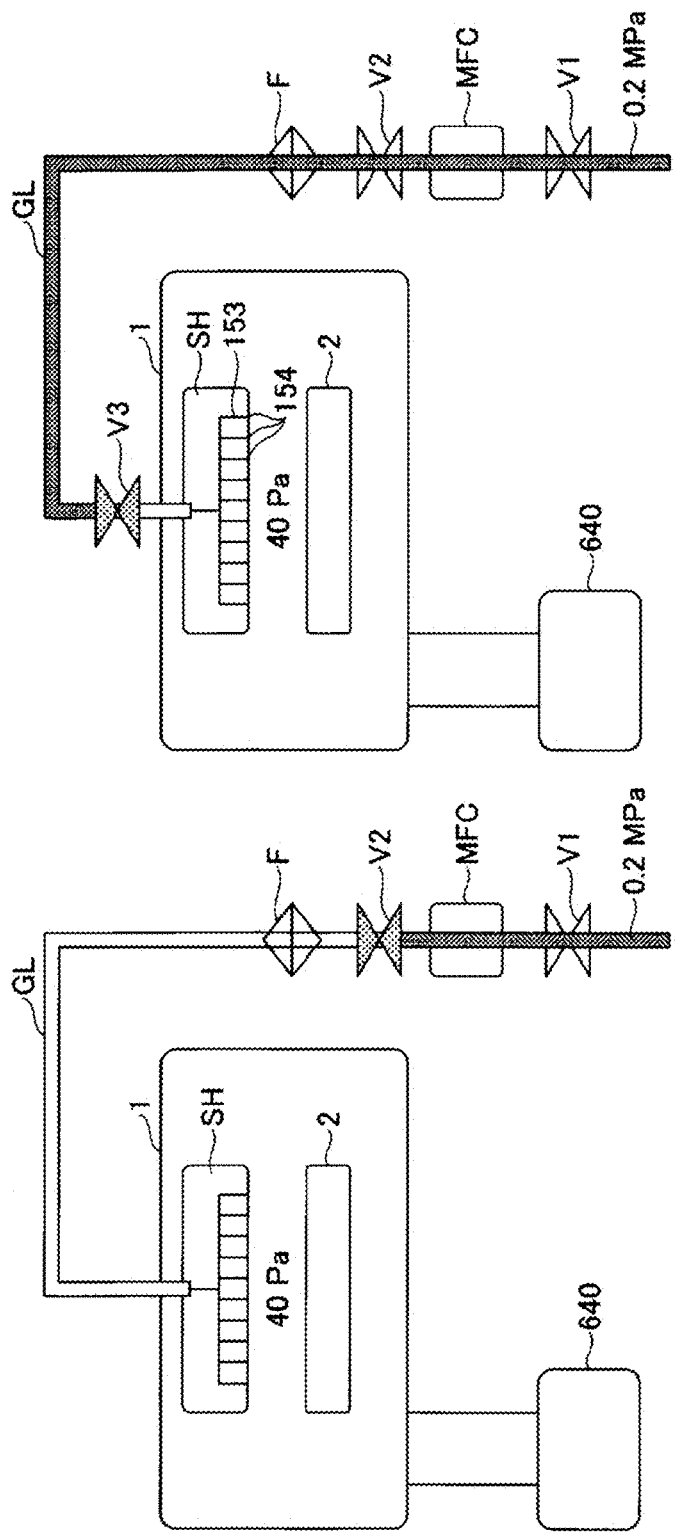

*FIG. 16A* *FIG. 16B*
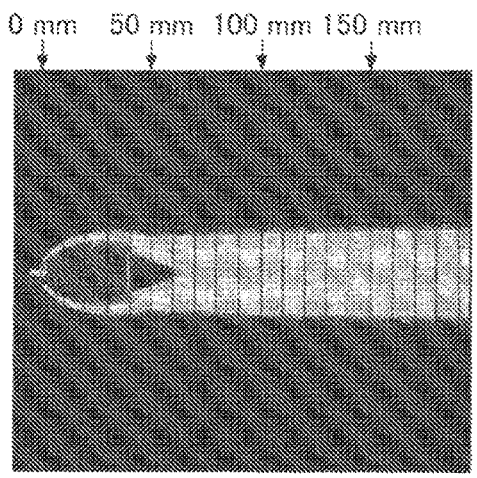 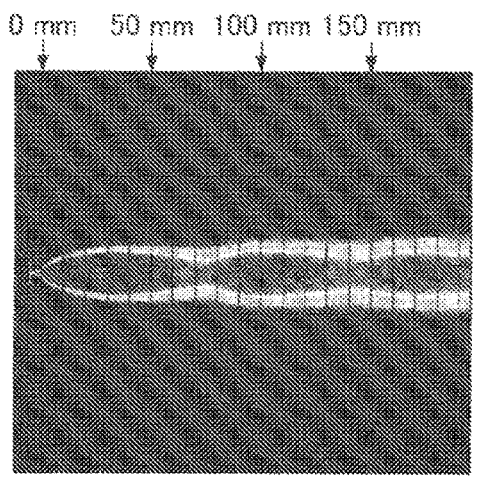

CLEANING METHOD AND SUBSTRATE PROCESSING APPARATUS

CROSS REFERENCE TO RELATED APPLICATIONS

This application is a national phase of PCT application No. PCT/JP2019/026151, filed on 1 Jul. 2019, which claims priority from Japanese Patent Application No. 2018-132558, filed on 12 Jul. 2018, all of which are incorporated herein by reference.

TECHNICAL FIELD

The present disclosure relates to a cleaning method and a substrate processing apparatus.

BACKGROUND

Patent Document 1 proposes, as a means for removing particles from a dust collector, flowing a subsonic gas through a closed space between the dust collector and a wafer stage to collect particles adhering to the dust collector to the outside together with the gas.

Further, for example, Patent Documents 2 and 3 propose removing particles adhering to a wafer by irradiating the wafer with a gas cluster.

PRIOR ART DOCUMENT

Patent Document

Patent Document 1: Japanese Patent Laid-Open Publication No. 2009-302185
Patent Document 2: Japanese Patent Laid-Open Publication No. 2015-026745
Patent Document 3: Japanese Patent Laid-Open Publication No. 2015-041646

SUMMARY OF THE INVENTION

Problem to be Solved

The present disclosure provides a technology capable of effectively removing contaminants adhering to a stage in a chamber.

Means to Solve the Problem

According to an aspect of the present disclosure, a cleaning method that removes contaminants adhering to a stage inside a chamber, includes a first step of setting an inside of the chamber to a predetermined vacuum pressure; a second step of supplying a first gas that forms a shock wave toward the stage; and a third step of supplying a second gas that does not form a shock wave toward the stage.

Effect of the Invention

According to an aspect, the contaminants adhering to a stage inside a chamber may be removed effectively.

BRIEF DESCRIPTION OF THE DRAWINGS

FIGS. 3A to 3H are views illustrating examples of simulation results of a shock wave generation procedure according to an embodiment.

FIGS. 4A to 4C are views illustrating examples of simulation results of a relationship between a distance between a stage and a shower head and a shock wave according to an embodiment.

FIGS. 10A and 10B are views illustrating examples of a gas line of a film forming apparatus according to an embodiment.

FIGS. 16A and 16B are views illustrating examples of a shape of a gas nozzle and simulation results according to an embodiment.

DETAILED DESCRIPTION TO EXECUTE THE INVENTION

Hereinafter, an exemplary embodiment of the present disclosure will be described with reference to the drawings. In the present specification and drawings, components having substantially the same configurations will be denoted by the same symbols, and the overlapping descriptions thereof will be omitted.

Introduction

In a chemical vapor deposition (CVD) device or an etching device, products derived from a process may adhere to a stage, become particles, be scattered during a wafer process, and adhere to a wafer (particle contamination). Therefore, a cleaning method that removes particles adhered to a stage is known in the related art.

Figure 1A:
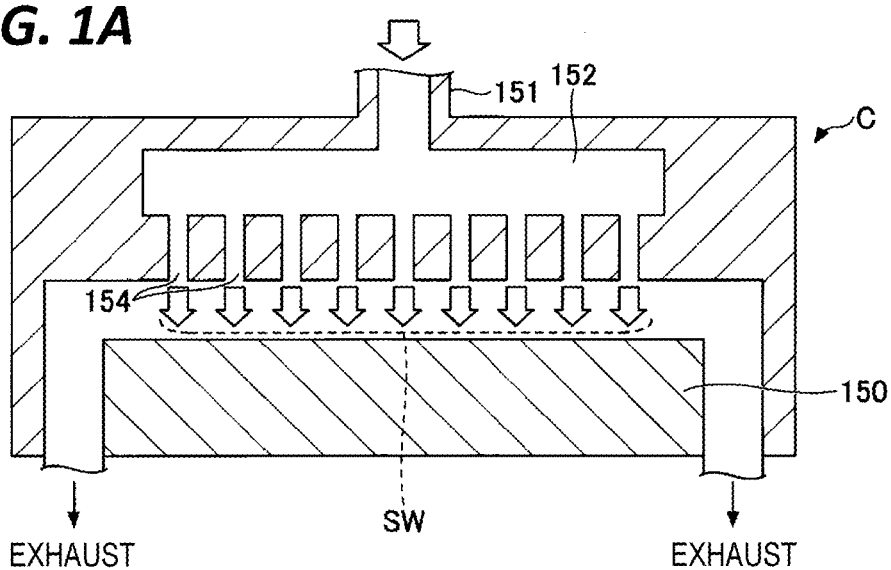
FIGS. 1A and 1B are views illustrating an example of a cleaning method in the related art.

An example of the cleaning method in the related art will be described with reference to FIGS. 1A and 1B. Here, a case in which a stage 150 in a chamber C having a shower head 152 illustrated in FIG. 1A is cleared will be described.

Figure 1B:
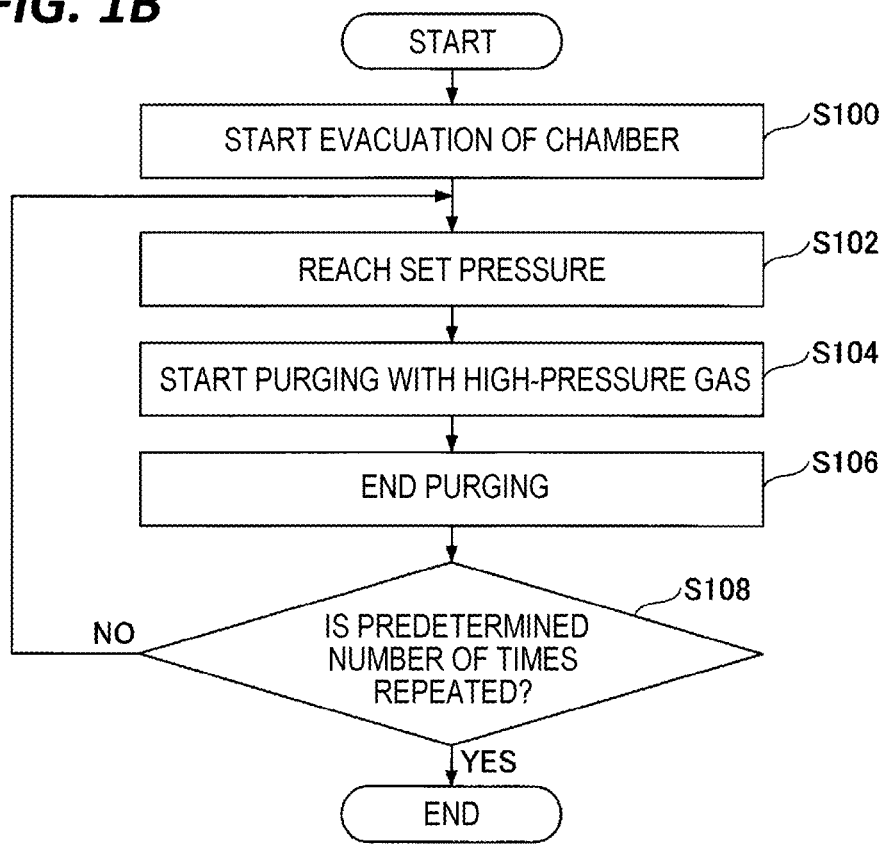

As illustrated an example of the cleaning method in the related art in FIG. 1B, in the cleaning method in the related art, first, evacuation in the chamber C is started using a vacuum pump (not illustrated) provided in the chamber C (step S100).

When the inside of the chamber C reaches the set pressure (step S102), a high-pressure gas supplied from a gas introduction port 151 is ejected toward the stage 150 from a plurality of gas holes 154 of the shower head 152 (step S104). Therefore, purging with the high-pressure gas is performed. A shock wave SW generated by this causes the particles adhering to the stage 150 to be separated. In this processing, while all of the steps are executed, the exhaust valve is controlled to be an open state.

When the purging with the high-pressure gas ends (step S106), it is determined whether the purging is repeated a predetermined number of times (step S108), and steps S102 to S108 are repeated until the predetermined number of times is executed, and the present processing ends after the predetermined number of times is executed.

However, in the above cleaning method, when the shock wave generation conditions may not be set appropriately, the removal range may be limited. Further, the particles separated by the shock wave may adhere to the stage again, or may stay in the chamber. In order to prevent such event, it is important to set the conditions for the shock wave to act effectively, or to remove the particles immediately to the outside of the chamber C after the particles adhering to the stage are separated.

Therefore, in the cleaning method according to an embodiment, a high-pressure gas is purged from a shower head to cause a shock wave to be applied to a stage to separate particles, and then, the particles are scavenged with a cyclone airflow of the gas supplied from an injector or the like to immediately exhaust to the outside of the chamber.

Hereinafter, the shock wave used in the cleaning method according to the embodiment will be described, and then, the cleaning method according to the embodiment and a substrate processing apparatus that executes the cleaning method will be described.

Shock Wave

Figure 2A:
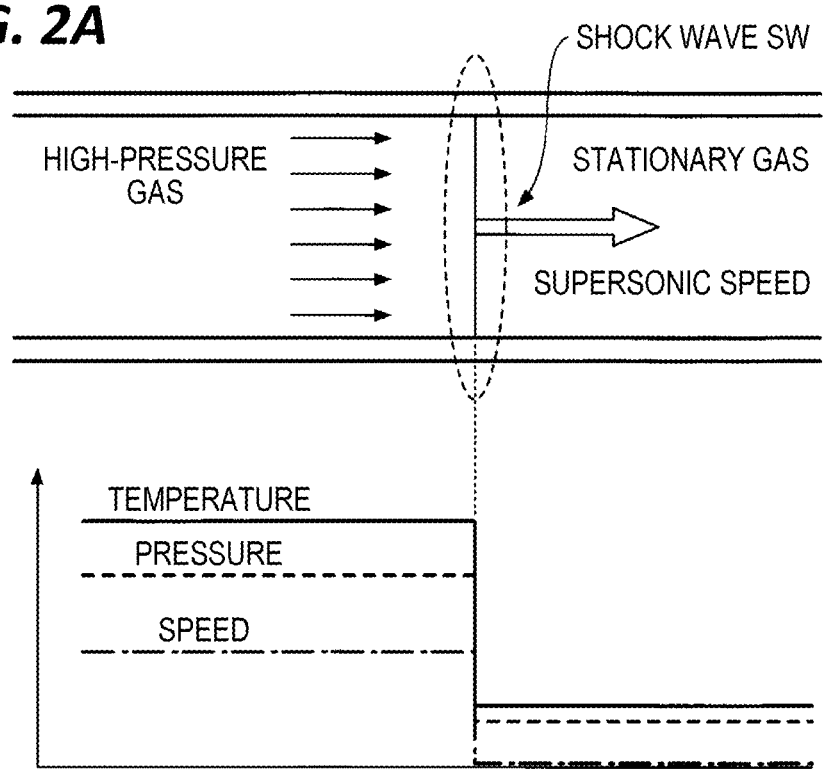
FIGS. 2A and 2B are views for explaining a shock wave according to an embodiment.
Figure 2B:
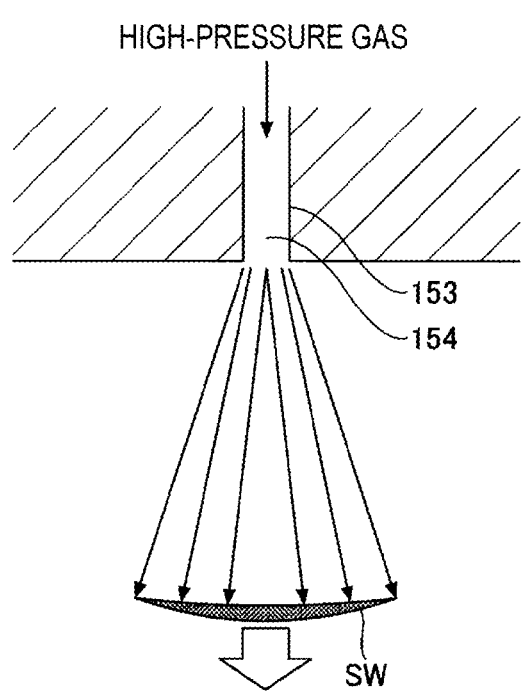

In the specification, a "shock wave" refers to a phenomenon in which a wave having discontinuous pressure and temperature propagates in a stationary gas at supersonic speed. A model illustrated in FIG. 2A schematically illustrates that, when a high-pressure gas having a predetermined temperature and a predetermined pressure flowing in a hollow-shaped object L at a certain speed becomes a stationary gas (speed=0) at an arbitrary position, a wave having discontinuous pressure and temperature is generated, becomes a shock wave, and propagates in the stationary gas at supersonic speed. In an example illustrated in FIG. 2B, a high-pressure gas at supersonic speed is jetted in an axially symmetric gas pipe 153, and discharged to a space having a pressure lower than the pressure in the gas pipe 153 from a gas hole 154. At this time, a shock wave SW is generated substantially perpendicular to the gas flow. The generated shock wave is also referred to as a vertical shock wave or a Mach disk.

In the embodiment, a high-pressure Ar gas (hereinafter, also referred to as a "high-pressure gas") is purged to generate the shock wave SW. The high-pressure gas is a gas having a pressure of an atmospheric pressure or higher, and may be an inert gas. Appropriate examples of the high-pressure gas may include an inert gas such as a rare gas represented by Ar, $N_2$ gas, and $CO_2$ gas. However, the present disclosure is not limited thereto, and the high-pressure gas may include a gas such as $CF_4$ or $NF_3$, which are inert in a steady state.

FIGS. 3A to 3H illustrate examples of results of the simulation of the generation procedure of the shock wave according to the embodiment. As illustrated in FIG. 3A, as the simulation condition, Ar gas is ejected from a gas ejecting port having the gas hole 154 set to have a small diameter at the tip. Further, the distance (Gap) from the lower end portion of the gas hole 154 to the stage surface is set to 20 mm. Further, a gas supply pressure (pressure in the gas pipe 153) is set to 0.2 MPa, and a pressure of the space to which the Ar gas is ejected is set to 40 Pa.

The state of the vertical shock wave for each elapsed time in FIGS. 3A to 3H will be described with the time when the high-pressure gas is ejected from the gas hole 154 as 0 second, under the above simulation conditions. FIG. 3A illustrates the simulation result illustrating the state of the gas after $1 \times 10^{-5}$ seconds. At this time, a flow of the Ar gas is formed in the space near the gas hole 154, but a shock wave is not generated. Thereafter, as illustrated by A1 in FIG. 3B, a shock wave begins to be generated at the tip of the flow of the Ar gas after $2 \times 10^{-5}$ seconds. As illustrated by A2 in FIG. 3C, a partially strong mass Flux (kg/m$^2$s) appears at the tip of the flow of the Ar gas after $3 \times 10^{-5}$ seconds. The mass Flux is a physical quantity indicating the mass of a gas passing through a unit area in a unit time, and is an index of the strength of a shock wave.

The mass Flux is induced from the following Equation (1).

$$\text{Mass Flux (kg/m}^2\text{s)} = \text{Gas density (kg/m}^3\text{s)} \times \text{Gas flow velocity in vertical direction (m/s)} \quad (1)$$

As illustrated by A3 in FIG. 3D, the peak value of the mass Flux at the tip of the flow of the Ar gas gradually increases after $4 \times 10^{-5}$ seconds, and the vertical shock wave SW illustrated in FIG. 3E reaches the stage after $5.9 \times 10^{-5}$ seconds. As illustrated in FIGS. 3F to 3H, after $6 \times 10^{-5}$ seconds, after $6.2 \times 10^{-5}$ seconds, and after $6.5 \times 10^{-5}$ seconds, the vertical shock wave SW having a mass Flux of a predetermined value or more is applied to the stage, and particles on the stage are separated.

When the distance (Gap) between the shower head and the stage is adjusted to an optimum value, the vertical shock wave SW having a mass Flux of a predetermined value or more may be applied to the stage, and the vertical shock wave acts strongly, and thus, the particles on the stage are easily separated.

Further, the higher the gas supply pressure, the stronger the vertical shock wave becomes. Further, as illustrated in Equation (1), when a gas having a high gas density (i.e., a large molecular weight) is used as the gas species supplied from the shower head, the vertical shock wave becomes strong.

From the simulation results, it is found that the vertical shock wave reaches the stage, and the vertical shock wave becomes larger as time passed. Then, it is found that, when the vertical shock wave reaches the stage, the particles on the stage are separated. Therefore, it is found that, when the vertical shock wave reaches the stage in the strongest state, that is, in the state where the mass Flux has the largest value, the separation effect of the particles on the stage is highest.

FIGS. 4A to 4C are views illustrating examples of simulation results of a distance between the stage and the shower head having the gas hole 154 and the vertical shock wave according to the embodiment. FIG. 4A illustrates the simulation result when the distance between the stage and the shower head is set to 5 mm, FIG. 4B illustrates the simulation result when the distance between the stage and the shower head is set to 10 mm, and FIG. 4C illustrates the simulation result when the distance between the stage and the shower head is set to 20 mm.

As illustrated in FIGS. 4A and 4B, when the distance between the stage and the shower head is 5 mm and 10 mm, the shock wave does not fully grow, and the shock wave does not act strongly on the stage. With respect to this, as illustrated in FIG. 4C, when the distance between the stage and the shower head is 20 mm, the vertical shock wave SW grows and a strong mass Flux (kg/m$^2$s) appears, and the vertical shock wave SW acts strongly.

In the following, descriptions will be made on a film forming apparatus including a mechanism that causes the vertical shock wave SW to act on the stage, and, additionally, prevents the particles separated from the stage from flying onto the wafer and contaminating the wafer as described above.

Film Forming Apparatus

Figure 5:
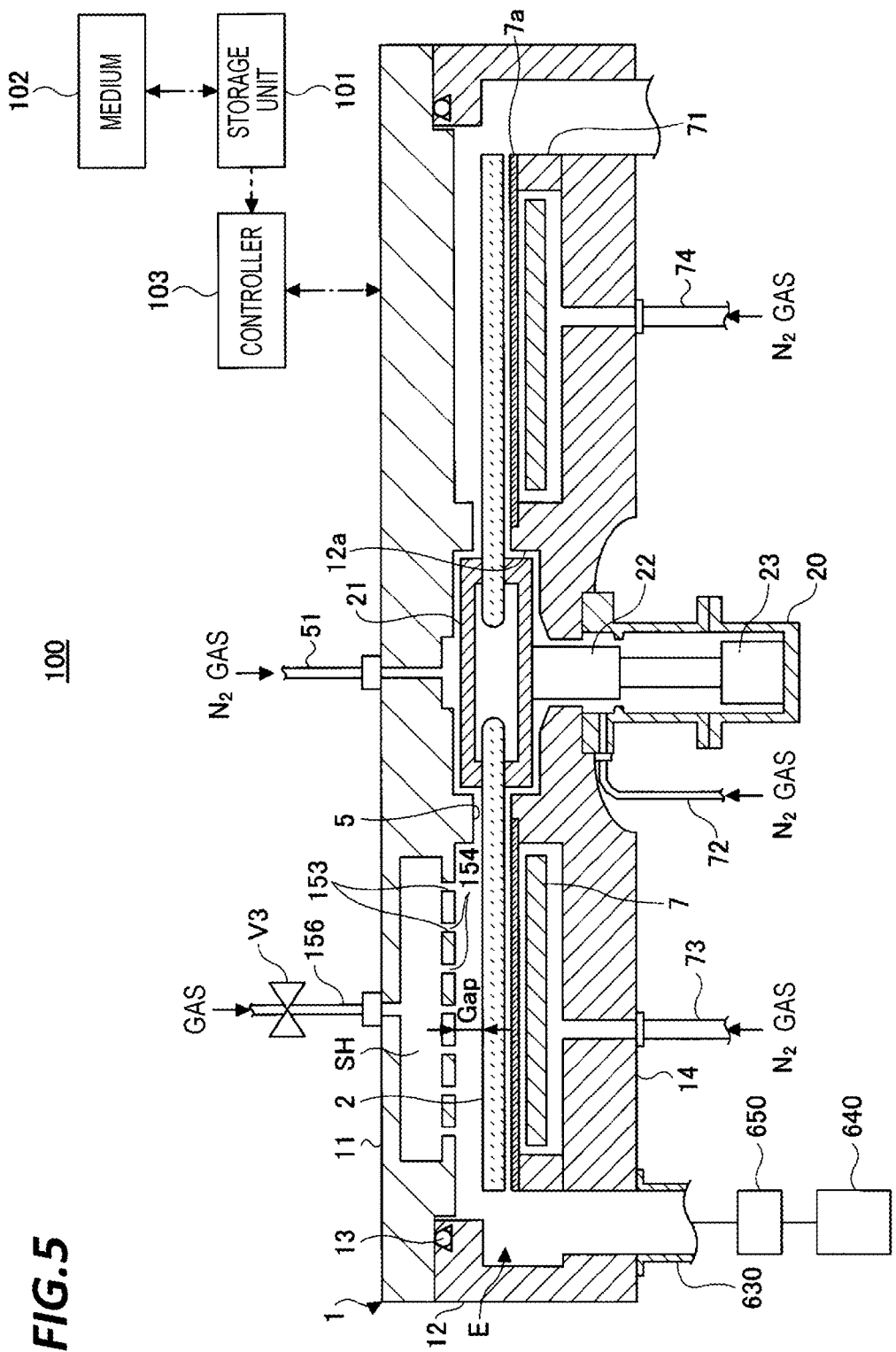
FIG. 5 is a view illustrating an example of a film forming apparatus according to an embodiment.
Figure 6:
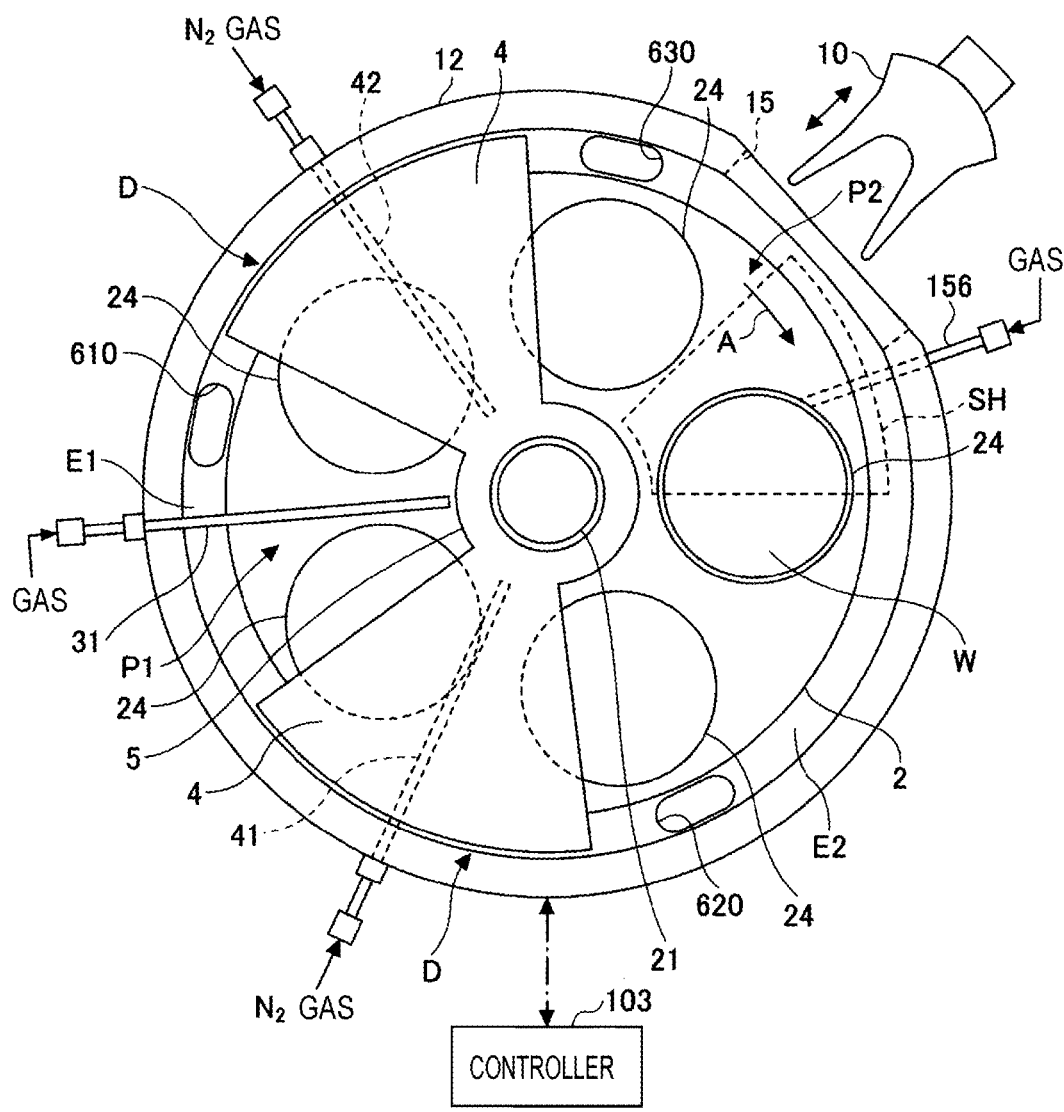
FIG. 6 is a view illustrating the film forming apparatus in FIG. 5 in plan view.

A film forming apparatus 100 according to an embodiment will be described with reference to FIGS. 5 and 6. FIG. 5 is a view illustrating an example of a vertical cross section of the film forming apparatus 100 according to the embodiment. FIG. 6 is a view illustrating the film forming apparatus 100 in FIG. 5 in plan view. The film forming apparatus 100 according to the embodiment is an apparatus capable of simultaneously forming a film on a plurality of wafers W while rotating.

The film forming apparatus 100 illustrated in FIG. 5 includes a flat vacuum container (chamber) 1 having a substantially circular planar shape, and a rotary table 2 provided in the vacuum container 1 and having a rotation center at the center of the vacuum container 1. The vacuum container 1 includes a container body 12 having a bottom and having a cylindrical shape, and a ceiling plate 11 disposed airtightly and detachably with respect to the upper surface of the container body 12 via a sealing member 13 such as an O-ring.

The rotary table 2 is fixed to a cylindrical core 21 at the center portion. The core 21 is fixed to an upper end of a rotating shaft 22 extending in the direction perpendicular to the core 21. The rotating shaft 22 penetrates a bottom 14 of the vacuum container 1, and is attached to a driving portion 23 that rotates the rotating shaft 22 around a vertical axis at the lower end. The rotating shaft 22 and the driving portion 23 are accommodated in a tubular case body 20 having an opened upper surface. A flange provided in the upper surface of the case body 20 is airtightly attached to the lower surface of the bottom 14 of the vacuum container 1, and thus, the airtight state between the internal atmosphere and the external atmosphere of the case body 20 is maintained.

As illustrated in FIG. 6, on the surface of the rotary table 2, circular recesses (substrate placing portion) 24 configured to dispose a plurality (five in the example) of wafers W are provided along a rotation direction (circumferential direction). For convenience, FIG. 6 illustrates the wafer W only in one recess 24. The recess 24 has an inner diameter slightly larger than the diameter of the wafer W, for example, by 4 mm, and a depth substantially equal to the thickness of the wafer W. Therefore, when the wafer W is accommodated in the recess 24, the surface of the wafer W and the surface (area where the wafer W is not placed on) of the rotary table 2 have the same height. In the bottom surface of the recess 24, through holes through which, for example, three elevating pins that support the back surface of the wafer W and move the wafer W up and down penetrate are formed.

FIG. 6 is a view explaining the structure inside the vacuum container 1, and for convenience of explanation, a shower head SH provided in the ceiling plate 11 and a gas supply pipe 156 are illustrated by broken lines, and the illustration of the other portion of the ceiling plate 11 is omitted. In a film forming processing, five wafers W are simultaneously processed while rotating the rotary table 2.

Above the rotary table 2, an injector 31 and injectors 41 and 42 that respectively contain quartz are disposed at intervals from each other in the circumferential direction of the vacuum container 1 (rotation direction of the rotary table 2 (arrow A in FIG. 6)). The shower head SH is provided in the ceiling plate 11.

In the illustrated example, the injector 41, the injector 31, the injector 42, and the shower head SH are placed in this order in the clockwise direction.

A valve V3 above the shower head SH illustrated in FIG. 5 is provided immediately above the vacuum container 1 in the gas supply pipe 156. When the valve V3 is opened, a predetermined gas from the gas supply pipe 156 connected to a gas supply is supplied to the shower head SH, passes through a plurality of gas pipes 153, and is supplied into the vacuum container 1 from the gas holes 154.

The base end portions of the injector 31 and the injectors 41 and 42 are fixed to the outer peripheral inner wall of the container body 12. Therefore, the injector 31 and the injectors 41 and 42 are introduced into the vacuum container 1 from the outer peripheral inner wall of the vacuum container 1, and are attached to extend horizontally with respect to the rotary table 2 along the radial direction of the container body 12.

In the embodiment, the injector 31 supplies a Si (silicon) containing gas serving as a reactive gas via, for example, a pipe and a flow rate control valve. The shower head SH supplies an oxidizing gas serving as a reactive gas via, for example, a pipe and a flow rate control valve. The injectors 41 and 42 supply $N_2$ (nitrogen) gas serving as a separation gas via, for example, a pipe and a flow rate control valve. The injector 31 may have a shower head structure, and the shower head SH may have an injector structure.

The injector 31 is provided with a plurality of gas holes opened toward the rotary table 2. The shower head SH is provided with a plurality of gas holes 154 opened toward the rotary table 2.

An area below the injector 31 becomes a first processing area P1 in which the reactive gas of the Si containing gas is adsorbed on the wafer W. An area below the shower head SH becomes a second processing area P2 in which the Si containing gas adsorbed on the wafer W in the first processing area P1 is oxidized.

With reference to FIG. 6, two convex portions 4 are provided in the vacuum container 1. The convex portions 4 are attached to the back surface of the ceiling plate 11 so as to protrude toward the rotary table 2, in order to form a separation area D together with the injectors 41 and 42. Further, the convex portions 4 have a fan-shaped planar shape with the top is cut in an arc shape.

In the lower surface of the ceiling plate 11 illustrated in FIG. 5, a protruding portion 5 surrounding the outer periphery of the core 21 that fixes the rotary table 2 is provided. In the embodiment, the inner arc of the convex portion 4 is connected to the protruding portion 5, and the outer arc is disposed along the inner peripheral surface of the container body 12 of the vacuum container 1. With the configuration, the convex portion 4 suppresses the reactive gas from invading from both sides of the separation area D, and suppresses the mixing of both reactive gases.

In the injectors 41 and 42 accommodated in the groove in the convex portion 4, a plurality of gas holes (see reference numeral 41a in FIGS. 11A and 11B) opened toward the rotary table 2 is placed along the longitudinal direction of the injectors 41 and 42.

When $N_2$ gas is supplied from the gas holes of the injectors 41 and 42, the $N_2$ gas acts as a counter flow with respect to the Si containing gas from the first area P1 and the oxidizing gas from the second area P2. Therefore, the Si containing gas from the first area P1 and the oxidizing gas from the second area P2 are separated by the separation area D. Therefore, the Si containing gas and the oxidizing gas are suppressed from being mixed and reacted in the vacuum container 1.

As illustrated in FIG. 5, the inner peripheral wall of the container body 12 is recessed outward, for example, from a portion facing the outer end surface of the rotary table 2 to the bottom 14 to form an exhaust area E. Specifically, the exhaust area communicating with the first processing area P1 is referred to as a first exhaust area E1, and the area communicating with the second processing area P1 is referred to as a second exhaust area E2. As illustrated in FIG. 6, a first exhaust port 610 and a second exhaust port 620 are formed in the bottoms of the first exhaust area E1 and the second exhaust area E2, respectively. The first exhaust port 610 and the second exhaust port 620 are respectively communicated with an exhaust port 630 illustrated in FIGS. 5 and 6, and connected to a vacuum pump 640 via a pressure controller 650. The first exhaust area E1 and the second exhaust area E2 are exhausted by the vacuum pump 640.

A heater unit 7 is provided in a space between the rotary table 2 and the bottom 14 of the vacuum container 1, and the wafer W on the rotary table 2 is heated to the temperature (e.g., 450° C.) set in the process recipe by the heater unit 7 via the rotary table 2. A ring-shaped cover member 71 is provided on the side below the vicinity of the peripheral edge of the rotary table 2. The cover member 71 divides the atmosphere from the space above the rotary table 2 to the first exhaust area E1 and the second exhaust area E2 and the atmosphere in which the heater unit 7 is placed to suppress the gas from invading into the area below the rotary table 2.

The bottom 14 in the portion close to the rotation center from the space in which the heater unit 7 is disposed protrudes upward so as to approach the core 21 in the vicinity of the center portion of the lower surface of the rotary table 2 to form a protruding portion 12a upward. A narrow space is formed between the protruding portion 12a and the core 21, and, additionally, the gap between the inner peripheral surface of the through hole for the rotating shaft 22 that penetrates the bottom 14 and the rotating shaft 22 is narrow. The narrow spaces are communicating with the case body 20. The case body 20 is provided with a purge gas supply pipe 72 configured to supply $N_2$ gas serving as a purge gas into the narrow space to purge the space.

Further, the bottom 14 of the vacuum container 1 is provided with a plurality of purge gas supply pipes 73 and 74 configured to purge the space in which the heater unit 7 is disposed at predetermined angular intervals in the circumferential direction below the heater unit 7. Further, a cover member 7a that covers between the ring-shaped cover member 71 and the upper end portion of the protruding portion 12a over the circumferential direction is provided between the heater unit 7 and the rotary table 2 in order to suppress the gas from invading into the area in which the heater unit 7 is provided. The cover member 7a may be made of, for example, quartz.

A separation gas supply pipe 51 is connected to the center portion of the ceiling plate 11 of the vacuum container 1, and $N_2$ gas serving as a separation gas is supplied to the space between the ceiling plate 11 and the core 21. The separation gas supplied to the space is ejected toward the peripheral edge along the surface of the wafer placing area of the rotary table 2 via the narrow gap between the protruding portion 5 and the rotary table 2.

Further, as illustrated in FIG. 6, in the outer peripheral inner wall of the vacuum container 1, a transfer port 15 configured to transport the wafer W between the external transfer arm 10 and the rotary table 2 is formed. The transfer port 15 is opened/closed by a gate valve. Further, the transport of the wafer W to and from the transfer arm 10 is performed at a position where the recess 24 serving as the wafer placing area in the rotary table 2 is facing the transfer port 15. Therefore, in the side below the rotary table 2, the elevating pin configured to penetrate the recess 24 and lift the wafer W from the back surface and the elevating mechanism are provided in a portion corresponding to the transport position of the wafer W.

The film forming apparatus 100 according to the embodiment is provided with a controller 103 including a computer configured to perform the control for the operation of the entire apparatus. The controller 103 includes a CPU. A control program that causes the film forming apparatus 100 to execute a film forming method or a cleaning method is stored in a storage unit 101 such as a read only memory (ROM) and a random access memory (RAM). The CPU of the controller 103 controls the film forming processing or the cleaning processing according to the order set in the recipe stored in the memory. The control program may be stored in a medium 102 such as a hard disk, a compact disk, a magneto-optical disk, a memory card, and a flexible disk, read into the storage unit 101 by a predetermined reading device, and installed in the controller 103.

Descriptions will be made on a film forming method executed in the film forming apparatus 100. In the embodiment, first, the gate valve is opened, and the wafer W is transported into the recess 24 in the rotary table 2 from the outside through the transfer port 15 by transfer arm 10.

Subsequently, the gate valve is closed, and the inside of the vacuum container 1 is exhausted to the vacuum degree reachable by the vacuum pump 640, and then, $N_2$ gas serving as a separation gas is ejected at a predetermined flow rate from the injectors 41 and 42. $N_2$ gas is also ejected at a predetermined flow rate from the separation gas supply pipe 51 and the purge gas supply pipes 72, 73, and 74. According to this, the inside of the vacuum container 1 is controlled to a preset processing pressure by the pressure controller 650. Subsequently, the wafer W is heated to, for example, 450° C. by the heater unit 70 while rotating the rotary table 2 in the clockwise direction at a rotation number of, for example, 20 rpm. Thereafter, a Si containing gas is supplied from the injector 31, and an oxidizing gas is supplied from the shower head SH.

By the rotation of the rotary table 2, the wafer W repeatedly passes through the first processing area P1, the separation area D, the second processing area P2, and the separation area D in this order. In the first processing area P1, molecules of the Si containing gas are adsorbed on the surface of the wafer W, and a molecular layer of the Si containing gas is formed. After passing through the separation area D, in the second processing area P2, the Si containing gas adsorbed on the surface of the wafer W is oxidized by the molecules of the oxidizing gas, and a single layer of a silicon oxide film is formed.

Next, when the wafer W reaches the first processing area P1 again due to the rotation of the rotary table 2, the molecules of the Si containing gas supplied from the injector 31 are adsorbed on the surface of the wafer W.

Subsequently, when the wafer W passes through the second processing area P2, the Si containing gas adsorbed on the surface of the wafer W is oxidized by the oxidizing gas, and a silicon oxide film is further formed. A silicon oxide film having a predetermined film thickness is formed by repeating the above process.

The rotary table 2 is an example of a stage on which the wafer W is placed, and may be configured to be movable up and down by an elevating mechanism (not illustrated). In this case, the distance (Gap) between the rotary table 2 and the shower head SH is adjusted to the optimum value in the following cleaning processing.

The film forming apparatus 100 is an example of a substrate processing apparatus that executes a predetermined processing on a substrate, and the configuration of the substrate processing apparatus is not limited thereto. For example, the substrate processing apparatus may not be rotated. Further, the substrate processing apparatus may be an apparatus that processes the wafer W one by one. The substrate processing apparatus is not limited to a film forming apparatus, but may be, for example, an etching apparatus or an ashing apparatus. The substrate processing apparatus may be an apparatus that processes the wafer W using plasma, or an apparatus that processes the wafer W using energy (e.g., heat or light) other than plasma.

The reaction products adhere to the stage on which the wafer is placed illustrated as an example of the rotary table 2, and fly onto the wafer W and become a factor that causes particle contamination. Therefore, in the following, a cleaning method according to an embodiment that effectively removes the contaminants that adhere to the rotary table 2 will be described.

Cleaning Method

First Embodiment

Figure 7:
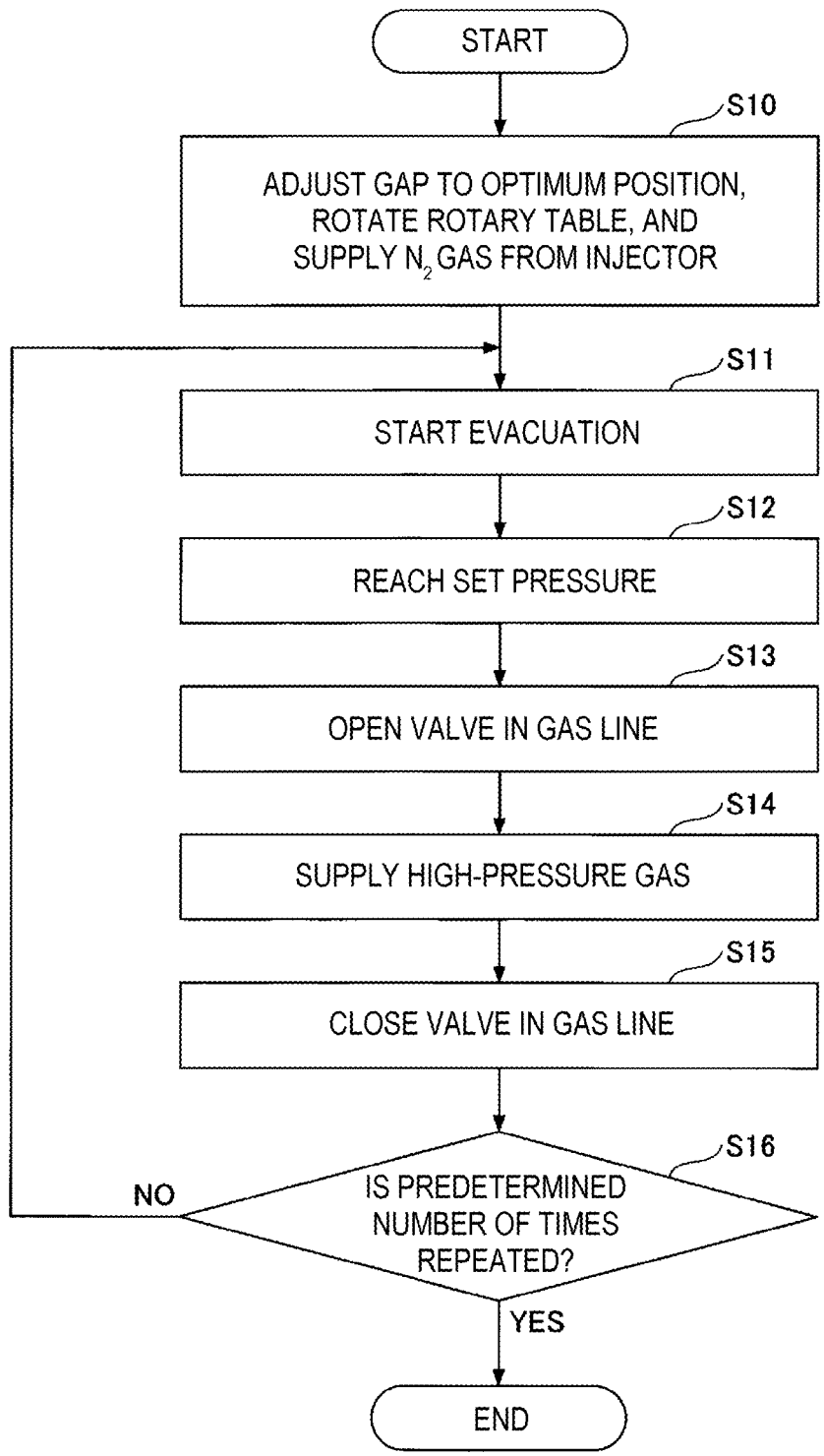
FIG. 7 is a flowchart illustrating an example of a cleaning method according to a first embodiment.

First, an example of a cleaning method according to a first embodiment will be described with reference to FIG. 7. FIG. 7 is a flowchart illustrating the example of the cleaning method according to the first embodiment. The cleaning method according to the first embodiment is controlled by the controller 103.

When the process is started, the controller 103 moves the rotary table 2 up and down by a driving mechanism, and adjusts the rotary table 2 such that the distance between the rotary table 2 and the shower head SH is optimized (step S10). Next, the rotary table 2 after completing the height adjustment is rotated, and $N_2$ gas is supplied from the injectors 31, 41, and 42 (step S10). It is desirable to supply $N_2$ gas from all of the injectors 31, 41, and 42, but $N_2$ gas may be supplied from at least one of the injectors 31, 41, and 42. Step S10 is an example of the third step of supplying the second gas that does not form a shock wave toward the rotary table 2. The second gas is not limited to $N_2$ gas, and may be an inert gas such as Ar gas or $CO_2$ gas, and may be a gas such as $CF_4$ or $NF_3$, which are inert in a steady state.

Next, evacuation in the vacuum container 1 is started using a vacuum pump 640 (step S11), and the inside of the vacuum container 1 is evacuated to, for example, several Pa to several tens Pa. Step S11 is an example of the first step of setting the inside of the chamber to a predetermined vacuum pressure. Further, it is naturally assumed that evacuation is performed in advance in step before step S10.

When the inside of the chamber reaches a set vacuum pressure (step S12), the valve V3 in the gas line provided at the position immediately above the vacuum container 1 is opened (step S13), and the high-pressure gas (e.g., Ar gas) stored in the gas supply pipe 156 on the upstream side of the valve V3 is supplied into the vacuum container 1 from the shower head SH (step S14). Therefore, the flow of the high-pressure gas becomes supersonic speed, and the particles adhering on the rotary table 2 are separated by the vertical shock wave generated at that time. Further, Step S14 is an example of the second step of supplying the first gas that forms a shock wave toward the rotary table 2. The first gas is not limited to Ar gas, and may be an inert gas such as $N_2$ gas or $CO_2$ gas, and may be a gas such as $CF_4$ or $NF_3$, which are inert in a steady state.

When the purging with the high-pressure gas ends, the valve V3 provided at the position immediately above the vacuum container 1 is closed (step S15). Next, it is determined whether the purging is repeated a predetermined number of times (step S16), and steps after step S11 are repeated until the predetermined number of times is executed, and the present processing ends after the predetermined number of times is executed.

In the processing, the valve on the exhaust side is always open, and the inside of the vacuum container 1 is always exhausted. Further, $N_2$ gas discharged from the injectors 31, 41, and 42 is always supplied from the start to the end of this processing. Further, the rotation of the rotary table 2 is not stopped until the end of the processing, and the timing of the purging with the high-pressure gas is controlled so as to clean the entire of the upper surface of the rotary table 2.

According to such cleaning method, a shock wave is applied on the rotary table 2 while rotating the rotary table 2. Further, $N_2$ gas is always introduced from the respective injectors 31, 41, and 42. The contaminants separated from the rotary table 2 by the shock wave are conveyed on the cyclone airflow of $N_2$ gas generated by the rotation of the rotary table 2, and are smoothly discharged to the outside of the vacuum container 1.

Further, the distance between the rotary table 2 and the shower head SH is adjusted to the position where the mass Flux of the vertical shock wave becomes maximum or as large as possible. Therefore, a strong shock wave is applied to the rotary table 2 by purging with the high-pressure gas, and the contaminants adhering on the rotary table 2 may be effectively removed.

Further, the vertical shock wave may spread evenly over the entire surface of the rotary table 2 by rotating the rotary table 2. Therefore, the contaminants adhering to the rotary table 2 may be completely removed.

Second Embodiment

Figure 8:
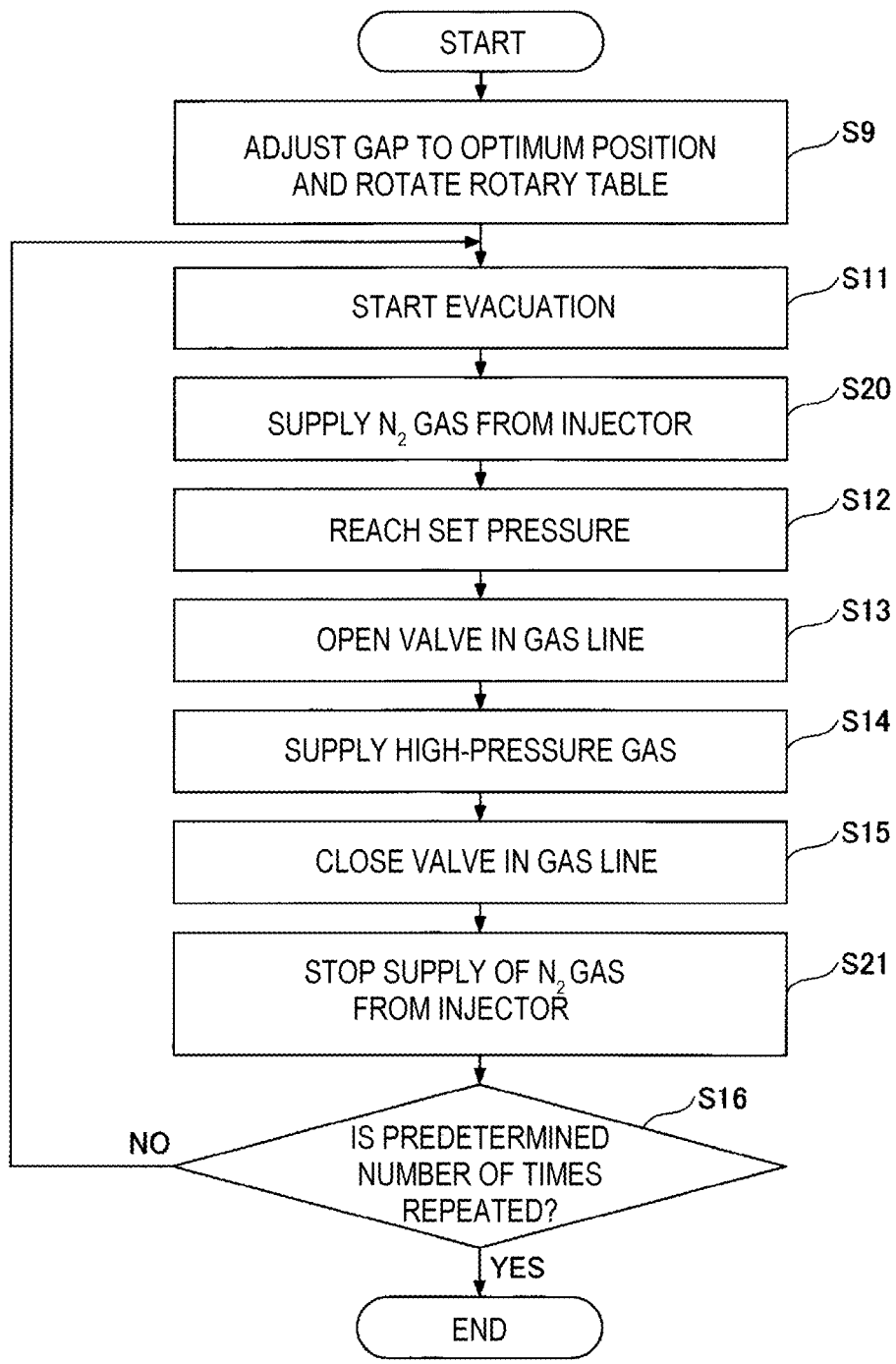
FIG. 8 is a flowchart illustrating an example of a cleaning method according to a second embodiment.

Next, an example of a cleaning method according to a second embodiment will be described with reference to FIG. 8. FIG. 8 is a flowchart illustrating the example of the cleaning method according to the second embodiment. When the processing is started, the controller 103 adjusts the rotary table 2 such that the distance between the rotary table 2 and the shower head SH is optimized, and then, the rotary table 2 is rotated (step S9).

Next, evacuation in the vacuum container 1 is started using a vacuum pump 640 (step S11). The start of the evacuation may be started before the rotation of the rotary table (step S9). Next, $N_2$ gas is supplied from the injectors 31, 41, and 42 (step S20: an example of the third step). $N_2$ gas may be supplied from at least one of the injectors 31, 41, and 42. When the set pressure is reached (step S12: an example of the first step), the valve V3 provided at the position immediately above the vacuum container 1 is opened (step S13). Therefore, the high-pressure gas stored in the gas supply pipe 156 on the upstream side is supplied into the vacuum container 1 from the shower head SH (step S14: an example of the second step). Therefore, the flow of the high-pressure gas becomes supersonic speed, and the particles adhering on the rotary table 2 are separated by the vertical shock wave generated at that time.

When the purging with the high-pressure gas ends, the valve V3 provided at the position immediately above the vacuum container 1 is closed (step S15). Next, the supply of $N_2$ gas from the injectors 31, 41, and 42 is stopped (step S21). Next, it is determined whether the purging is repeated a predetermined number of times (step S16), and steps after step S11 are repeated until the predetermined number of times is executed, and the present processing ends after the predetermined number of times is executed.

In the processing, the valve on the exhaust side is always open, and the inside of the vacuum container 1 is always exhausted. Further, the rotation of the rotary table 2 is not stopped until the end of the processing, and the timing of the purging with the high-pressure gas is controlled so as to clean the entire of the upper surface of the rotary table 2.

According to such cleaning method, the high-pressure gas is supplied while rotating the rotary table 2, and a shock wave is applied on the rotary table 2. Further, $N_2$ gas is introduced from the respective injectors 31, 41, and 42 during at least the second step in which the high-pressure gas is supplied. Therefore, the contaminants separated from the rotary table 2 by the shock wave are more smoothly conveyed on the cyclone airflow of $N_2$ gas, and are discharged to the outside of the vacuum container 1.

Third Embodiment

Figure 9:
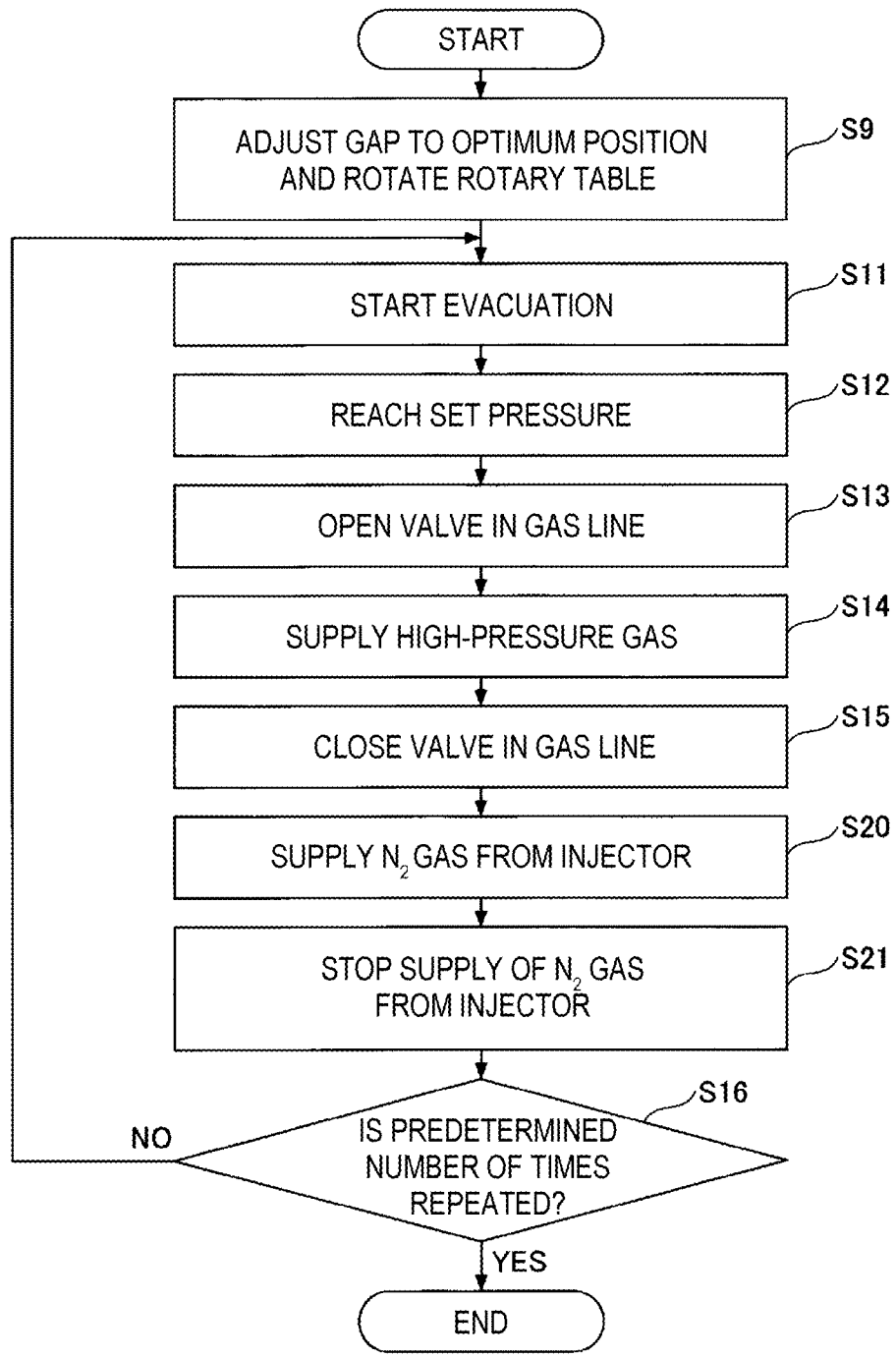
FIG. 9 is a flowchart illustrating an example of a cleaning method according to a third embodiment.

Next, an example of a cleaning method according to a third embodiment will be described with reference to FIG. 9. FIG. 9 is a flowchart illustrating the example of the cleaning method according to the third embodiment. When the processing is started, the controller 103 adjusts the rotary table 2 such that the distance between the rotary table 2 and the shower head SH is optimized, and then, the rotary table 2 is rotated (step S9).

Next, evacuation in the vacuum container 1 is started using a vacuum pump 640 (step S11). The start of the evacuation may be executed before the rotation of the rotary table (step S9). When the set pressure is reached (step S12: an example of the first step), the valve V3 provided at the position immediately above the vacuum container 1 is opened (step S13). Therefore, the high-pressure gas stored in the gas supply pipe 156 on the upstream side is supplied into the vacuum container 1 from the shower head SH (step S14: an example of the second step). Therefore, the flow of the high-pressure gas becomes supersonic speed, and the particles adhering on the rotary table 2 are separated by the vertical shock wave generated at that time.

When the purging with the high-pressure gas ends, the valve V3 provided at the position immediately above the vacuum container 1 is closed (step S15). Next, $N_2$ gas is supplied from the injectors 31, 41, and 42 (step S20: an example of the third step). $N_2$ gas may be supplied from at least one of the injectors 31, 41, and 42. After a predetermined time has elapsed, the supply of $N_2$ gas from the injectors 31, 41, and 42 is stopped (step S21). Next, it is determined whether the purging is repeated a predetermined number of times (step S16), and steps after step S11 are repeated until the predetermined number of times is executed, and the present processing ends after the predetermined number of times is executed.

In the processing, the valve on the exhaust side is always open, and the inside of the vacuum container 1 is always exhausted. Further, the rotation of the rotary table 2 is not stopped until the end of the processing, and the timing of the purging with the high-pressure gas is controlled so as to clean the entire of the upper surface of the rotary table 2.

According to such cleaning method, step S14 in which the high-pressure gas is supplied, and step S20 in which $N_2$ gas is supplied from the injectors 31, 41, and 42 are executed alternately, and the first gas supplied in step S14 and the second gas supplied in step S20 are supplied alternately. Therefore, also, the contaminants are separated from the rotary table 2 by the shock wave and more smoothly conveyed on the cyclone airflow of $N_2$ gas, and are discharged to the outside of the vacuum container 1.

In any of the cleaning methods according to the first to third embodiments, the cleaning method is executed after the distance between the shower head SH and the rotary table 2 is adjusted. Further, the valve V3 that opens/closes the gas supply pipe 156 is provided at the position immediately above the vacuum container 1, and the high-pressure gas stored in the gas supply pipe 156 on the upstream side is supplied to the shower head SH by controlling the opening/closing of the valve V3. Therefore, a shock wave may be formed on the rotary table 2 by intermittently supplying the high-pressure gas.

Gas Line for Obtaining Shock Wave

Descriptions will be made on an example of the gas line of the film forming apparatus 100 configured to intermittently supply Ar gas with reference to FIGS. 10A and 10B. FIGS. 10A and 10B are views illustrating examples of gas lines of a film forming apparatus according to a comparative example and an embodiment.

FIG. 10A illustrates an example of a gas line in the comparative example, and FIG. 10B illustrates an example of a gas line in the embodiment. In the gas line in the comparative example, two valves V1 and V2, and a flow rate controller MFC between the valves V1 and V2 are provided in a gas line GL, and a filter F is attached to the vacuum container 1 side downstream of the valve V2.

In the gas line in the embodiment, the two valves V1 and V2, and a flow rate controller MFC between the valves V1 and V2 are provided in the gas line GL, and the filter F is attached on the downstream side of the valve V2. Additionally, the valve V3 is attached immediately above the vacuum container 1. In the embodiment, the filter F may not be provided.

In the gas line in the comparative example illustrated in FIG. 10A, when the valves V1 and V2 are opened, Ar gas supplied from a gas supply source flows through the gas line GL. Since a pressure loss occurs in the filter F immediately after the valves V1 and V2 are opened, the reaching pressure of Ar gas supplied to the shower head SH when the valves V1 and V2 are opened is decreased. For example, the pressure in the upstream side is 0.2 MPa when the valve V2 is closed. In the gas line in the comparative example, the valve V2 is closed, and the pressure of Ar gas supplied to the shower head SH becomes lower than 0.2 MPa due to the pressure loss in the filter F.

Meanwhile, in the gas line in the embodiment illustrated in FIG. 10B, when the valves V1 and V2 are opened, Ar gas supplied from a gas supply source flows through the gas line GL. The occurrence of the pressure loss may be suppressed by eliminating the filter F or using a low-pressure type filter. Further, the gas line GL may be filled with Ar gas immediately before the vacuum container 1 by closing the valve V3 immediately above the vacuum container 1 until a predetermined timing at which a shock wave is generated. As a result, the pressure in the gas line GL may be rapidly increased. For example, when the pressure in the gas line GL immediately before the vacuum container 1 is 0.2 MPa when the valve V3 is closed, the reaching pressure of Ar gas supplied to the shower head SH when the valve V3 is opened is not decreased, but is maintained in a high-pressure state of approximately 0.2 MPa.

As described above, in the gas line in the embodiment, the high-pressure gas may be supplied to the shower head SH by providing the valve V3 immediately above the vacuum container 1, and thus, the pressure in the gas pipe 153 may be increased to a high-pressure state of approximately 0.2 MPa in an extremely short time. Therefore, the high-pressure gas is jetted at supersonic speed from the gas hole 154, and is ejected to the space in the low pressure (approximately 40 Pa) lower than the pressure (approximately 0.2 MPa) in the gas pipe 153. The particles adhering on the rotary table 2 may be effectively separated by the vertical shock wave generated at that time.

The pressure of Ar gas that generates a shock wave may be at atmospheric pressure or higher. However, in the second step, it is desirable to supply the first gas in a state where the pressure in the gas pipe 153 through which Ar gas is supplied is five times or more, or, furthermore, ten times or more, with respect to the pressure in the vacuum container 1.

Cyclone Airflow According to $N_2$ Gas Introduction

In the cleaning methods according to the first to third embodiments, the rotary table 2 is rotated to continuously exhaust the inside of the vacuum container 1 while at least the second step and the third step are executed. In this state, $N_2$ Gas is supplied from the gas holes of the injectors 31, 41, and 42.

Figure 11A:
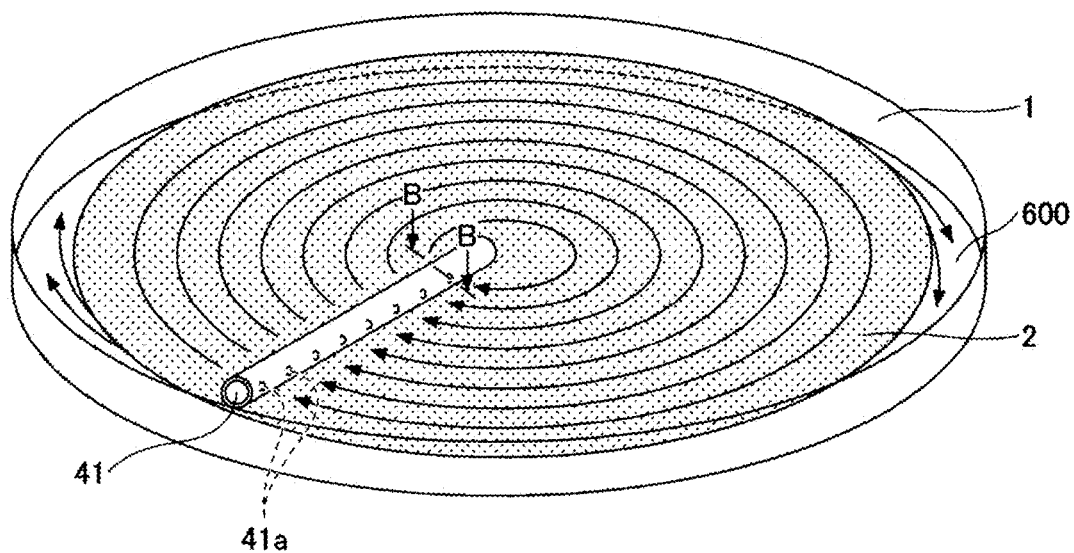
FIGS. 11A and 11B are views illustrating an example of introduction of $N_2$ gas according to an embodiment.

FIG. 11A is a view illustrating an example of a simulation result of introduction of $N_2$ gas according to the embodiment. In the simulation, a line of flow of a gas when $N_2$ gas is supplied from the gas holes 41a of the injector 41 in a state where the rotary table 2 is rotating in the clockwise direction. Further, in the simulation, the space between the outer periphery of the rotary table 2 and the inner wall of the vacuum container 1 is a ring-shaped exhaust port 600, and the exhaust port 600 is connected to the vacuum pump 640 via the exhaust pipe 630 (see FIG. 5).

Figure 11B:
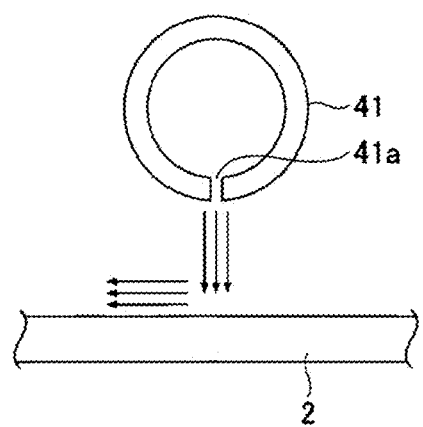

With reference to FIG. 11B illustrating a cross section taken along B-B in FIG. 11A, the gas hole 41a in the injector 41 is provided immediately below toward the rotary table 2, and supplies $N_2$ gas immediately below. According to the simulation result in FIG. 11A, $N_2$ gas forms a cyclone airflow so as to crawl on the rotary table 2 by the rotation of the rotary table 2, and is exhausted from the ring-shaped exhaust port 600 between the outer periphery of the rotary table 2 and the inner wall of the vacuum container 1. Therefore, it is found that the contaminants separated from the rotary table 2 by the shock wave are smoothly conveyed on the cyclone airflow of $N_2$ gas, and may be discharged to the outside of the vacuum container 1 from the ring-shaped exhaust port 600.

From the above, in the film forming apparatus 100 in FIG. 5, $N_2$ gas is supplied from the injector 41 horizontally provided in the vicinity of the rotary table 2 in the third step. Therefore, a cyclone airflow of $N_2$ gas is formed, and the contaminants separated from the rotary table 2 by the shock wave may be induced to the exhaust port. In the example in FIGS. 11A and 11B, the example in which $N_2$ gas is supplied from the injector 41 is illustrated. However, the present disclosure is not limited thereto, and $N_2$ gas is supplied from at least one of the injectors 41 and 42, and the injector 31. Further, it is desirable to supply $N_2$ gas from the injectors 41 and 42, and the injector 31.

When the rotary table 2 is rotated during the cleaning processing, $N_2$ gas is delivered to the outside of the rotary table 2 by the cyclone airflow, and thus, it is desirable that the exhaust port is located in the outer peripheral portion of the rotary table 2. Therefore, it is possible to promote the smooth discharge of the contaminants while preventing the contaminants separated from the rotary table 2 conveyed on the cyclone airflow of $N_2$ gas formed to crawl on the rotary table 2 from adhering again.

As described above, according to the cleaning methods according to the first to third embodiments, it is possible to evenly apply the vertical shock wave to the entire surface of the rotary table 2 by rotating the rotary table 2. Therefore, the contaminants adhering to the rotary table 2 may be completely separated. Further, $N_2$ gas supplied from the injectors 31, 41, and 42 becomes the cyclone airflow, and the separated contaminants may be smoothly conveyed to the exhaust side.

However, the introduction of $N_2$ gas is not limited to using an injector. As illustrated in (a) in FIG. 12, a gas supply pipe 55 serving as a center shaft may be disposed in the center of the rotary table 2, gas nozzles 56 may be provided at equal intervals from the side wall of the gas supply pipe 55, and a gas may be supplied in the circumferential direction from a gas hole 56a provided in the gas nozzle 56. As illustrated in (b) in FIG. 12, a gap may be provided between the bottom surface of the gas supply pipe 55 serving as the center shaft and the rotary table 2, and the gas may be supplied in the circumferential direction from the gap.

Figure 12:
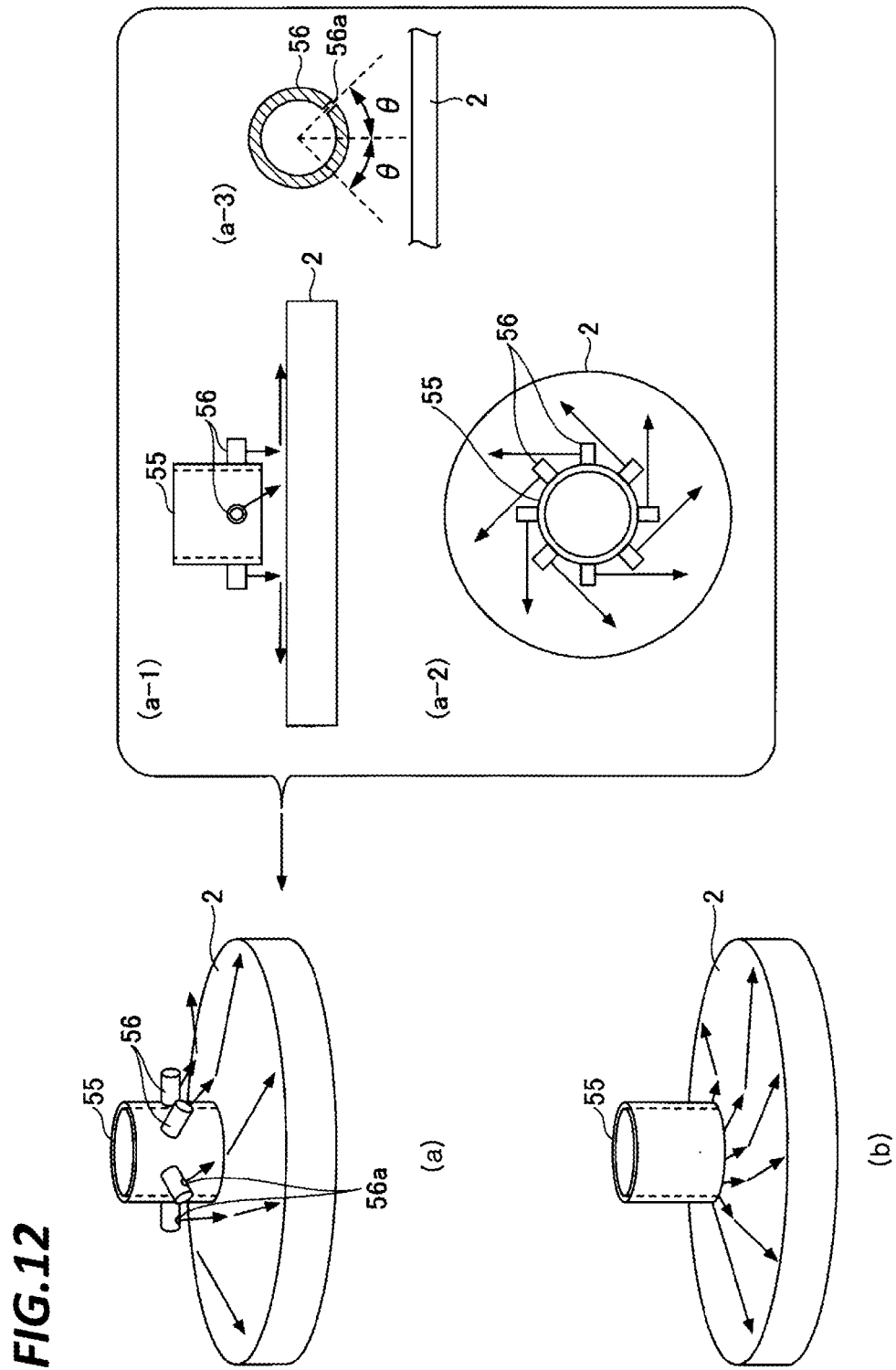
FIG. 12 is a view illustrating an example of introduction of $N_2$ gas according to an embodiment.

(a-1) in FIG. 12 is an example of a side view of (a) in FIG. 12, and (a-2) is an example of a plan view of (a) in FIG. 12. The $N_2$ gas flowing in the gas supply pipe 55 is ejected toward the rotary table 2 from the gas hole 56a at the position of an angle θ illustrated in (a-3) in FIG. 12, which is a cross section of the gas nozzle 56, and flows in the tangential direction of the circumference according to the rotary direction of the rotary table 2 as illustrated in (a-2) in FIG. 12.

The angle θ of the gas hole of the gas nozzle 56 is not limited to immediately below the gas nozzle 56, and may be an angle smaller than 90° from immediately below the gas nozzle 56. That is, when it is assumed that the angle positioned immediately below the gas hole 56a of the gas nozzle 56 is 0°, the angle θ of the gas hole 56a may be formed at the position satisfying −90°<θ<90° in the circumferential direction.

$N_2$ gas is delivered to the outer peripheral side of the rotary table 2 by the cyclone airflow also by supplying the $N_2$ gas using the gas nozzle 56 illustrated in FIG. 12. Therefore, in the case of this configuration, it is desirable that the exhaust port is disposed on the outer peripheral side of the rotary table 2. Also with respect to the angle θ of the gas hole 41a of the injector 41 illustrated in FIGS. 11A and 11B, when it is assumed that the angle positioned immediately below the gas hole 41a is 0°, the angle θ of the gas hole 41a may be formed at the position satisfying −90°<θ<90° in the circumferential direction.

Figure 13:
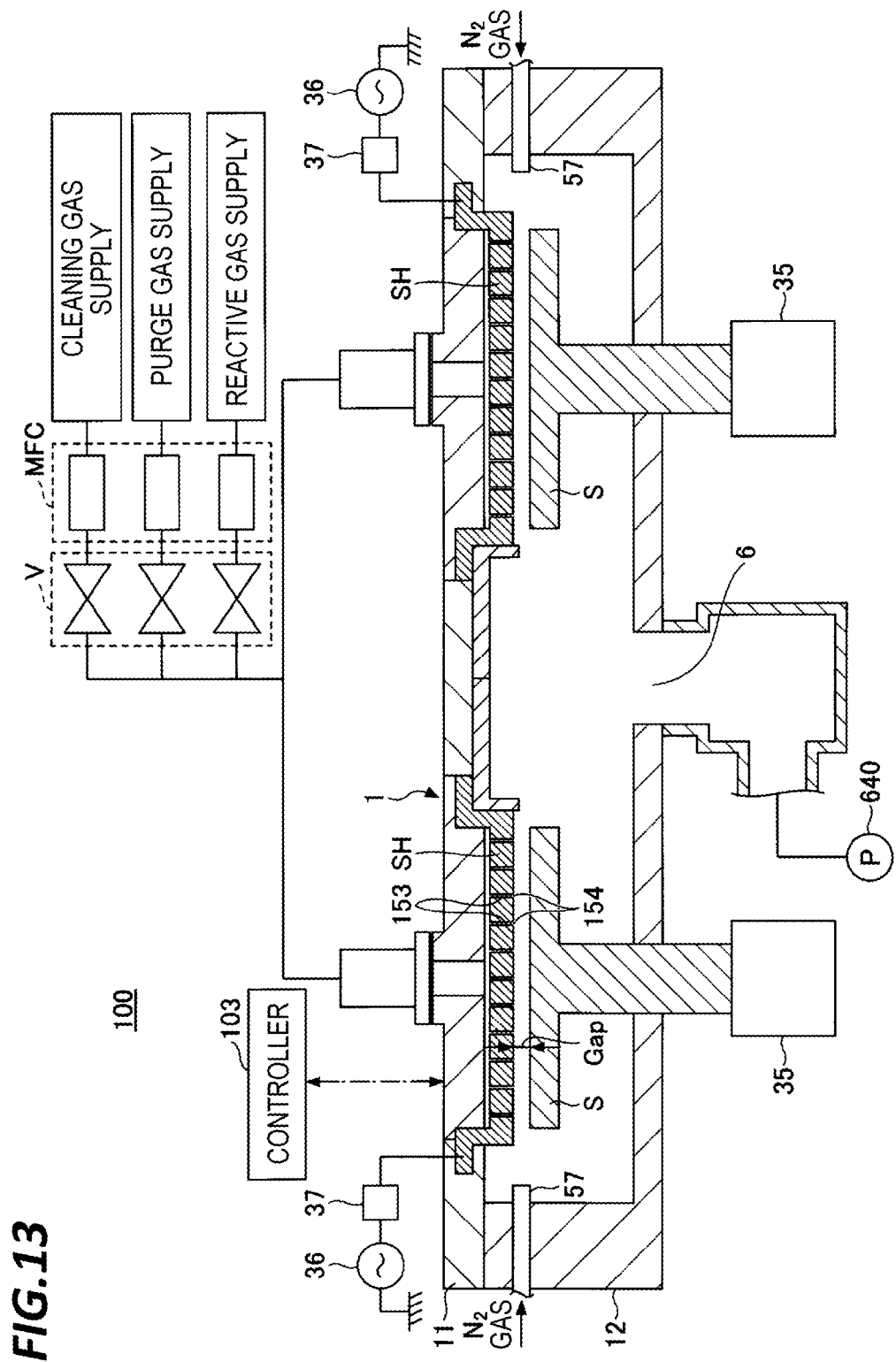
FIG. 13 is a view illustrating an example of a film forming apparatus according to an embodiment.

FIG. 13 illustrates another example of the film forming apparatus 100 according to the embodiment. As illustrated in the film forming apparatus 100, a plurality of gas nozzles 57 may penetrate at equal intervals in the circumferential direction from the side wall of the vacuum container 1. In this case, the introduction of $N_2$ gas in the third step may be performed using the gas nozzle 57.

The film forming apparatus 100 illustrated in FIG. 13 is an example of another substrate processing apparatus capable of executing the cleaning method according to the first to third embodiments. The film forming apparatus 100 includes the vacuum container 1. The vacuum container 1 includes the container body 12 and the ceiling plate 11 disposed airtightly and detachably with respect to the upper surface of the container body 12. Four stages S are provided in the container body 12, and the wafer W is placed on each stage S.

The shower head SH is provided in the ceiling plate 11 above the each stage S. Each stage S may be configured to be movable up and down by the elevating mechanism 35. Therefore, the distance (Gap) between the stage S and the shower head SH may be adjusted.

Each gas is supplied to the shower head SH at a predetermined timing from a gas supply (a cleaning gas supply, a purge gas supply, and a reactive gas supply). A radio-frequency RF power source 36 is connected to the shower head SH via a matcher 37.

For example, when forming a film, a valve V and the flow rate controller MFC are controlled to supply a film formation gas (reactive gas) to the shower head SH, and a radio-frequency power having a predetermined frequency, for example, 13.56 MHz is applied to the shower head SH from the RF power source 36. Therefore, plasma is generated from the film formation gas supplied to the shower head SH, and a film forming processing is executed on the wafer on the stage S.

When performing the cleaning processing, the valve V and the flow rate controller MFC are controlled to supply a cleaning gas (e.g., Ar gas) to the shower head SH (example of the second step), and a shock wave by the Ar gas is generated to separate the particles on the stage S. Further, simultaneously or alternately with the second step, $N_2$ gas of the purge gas is supplied (example of the third step) from the gas nozzle 57 provided on the outer peripheral inner wall of the vacuum container 1 and/or the purge gas supply, and the separated particles are conveyed on the airflow of the $N_2$ gas. The conveyed particles are ejected by the vacuum pump 640 from the exhaust port 6.

Figure 14A:
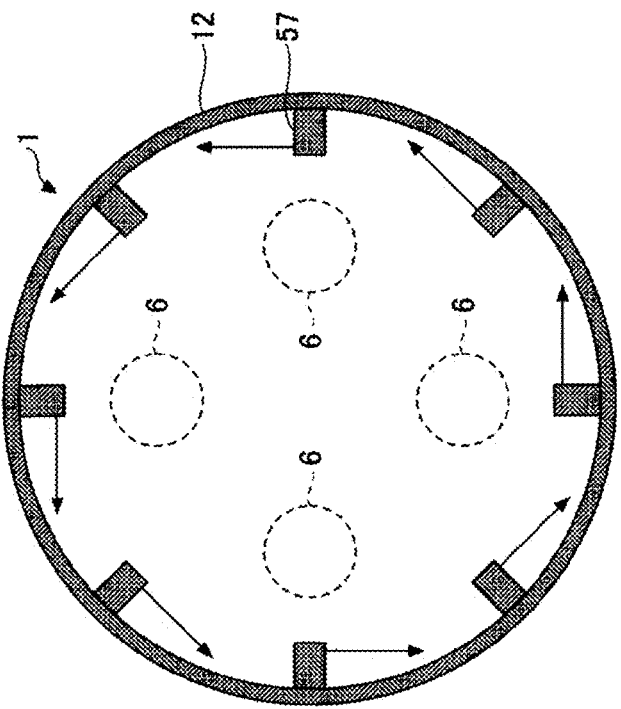
FIGS. 14A and 14B are views illustrating an example of a cyclone airflow and exhausting according to an embodiment.

Specifically, in the case of the film forming apparatus 100 illustrated in FIG. 13, as illustrated in FIG. 14A, a plurality of gas nozzles 57 is provided at equal intervals on the outer peripheral inner wall of the container body 12, and a gas is supplied in the tangential direction from the gas hole of the gas nozzle 57 provided in the circumferential direction. When it is assumed that the angle positioned immediately below the gas hole of the gas nozzle 57 is 0°, the angle θ of the gas hole of the gas nozzle 57 may be formed at the position satisfying −90°<θ<90° in the circumferential direction. However, it is desirable to exclude a case where θ is 0°. This is because, when the stage is not rotated, the cyclone airflow is hardly generated at θ=0°.

In this case, for example, as illustrated in FIG. 14A, it is desirable that the exhaust port 6 is provided in the center of the bottom of the vacuum container 1. Therefore, the cyclone airflow of the $N_2$ gas flowing on the inner side toward the center side from the outer peripheral side of the vacuum container 1 is created, the particles are conveyed to the center side of the vacuum container 1 to exhaust from the central exhaust port 6.

Figure 14B:
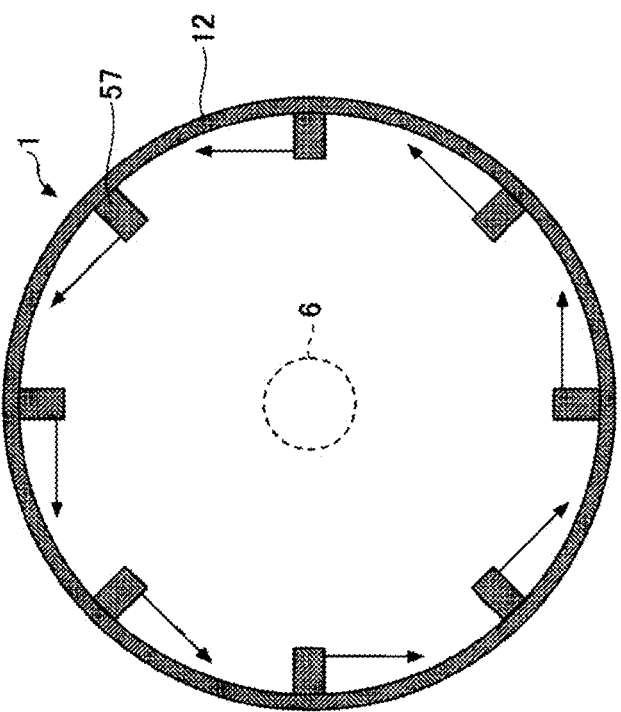

Further, the exhaust port 6 is not limited to one provided at the center, and may be provided at a plurality of locations. In the example in FIG. 14B, four exhaust ports 6 are provided below the four stages S, respectively, and the particles conveyed on the cyclone airflow of the Na gas supplied from the gas nozzle 57 are exhausted from the four exhaust ports 6.

The example in which one or a plurality of exhaust ports 6 is provided in the outer periphery or in the center of the vacuum container 1, or in the bottom of the vacuum container 1 therebetween (below the stage) has been described, but the present disclosure is not limited thereto. For example, one or a plurality of exhaust ports 6 may be provided in the ceiling of the vacuum container 1, or may be provided in the bottom and ceiling of the vacuum container 1.

Shape of Gas Nozzle

Figure 15A:
FIGS. 15A and 15B are views illustrating examples of a gas nozzle according to an embodiment.
Figure 15B:

The shape of the gas nozzles 56 and 57 (see FIG. 12 to FIG. 14B), and an example of simulation results illustrating the state of gas injection will be described with reference to FIGS. 15A and 15B and FIGS. 16A and 16B. FIGS. 15A and 15B are views illustrating a shape of a nozzle used in the simulation. FIGS. 16A and 16B are views illustrating examples of each shape of a gas nozzle and simulation results of gas injection.

Gas nozzles having the shape illustrated in FIGS. 15A and 15B are used in the simulation. The gas nozzle illustrated in FIG. 15A has a shape straight toward a gas port. The gas nozzle illustrated in FIG. 15B has a tapered shape widened by approximately 16° toward a gas port. In the gas nozzle in FIG. 15A, the diameter φ of the gas port of the inlet and outlet of the gas is 2 mm. In the gas nozzle in FIG. 15B, the diameter φ of the inlet of the gas is 0.5 mm, but the diameter φ of the gas port serving as the outlet of the gas is 2 mm.

With respect to the gas nozzles having the above two shapes, the simulation results obtained from when $N_2$ gas at 10 (l/min) and 20° C. is injected into the space from the gas nozzle is illustrated in FIGS. 16A and 16B. According to the results, in the case of the gas nozzle having the straight shape in FIG. 15A, the jet of the $N_2$ gas injected from the gas port is immediately decelerated, and the high-speed jet of the $N_2$ gas does not extend to 100 mm to 150 mm from the gas port.

With respect to this, in the case of the gas nozzle having the tapered shape in FIG. 15B, the gas jet of the high-speed $N_2$ gas injected from the gas port extends to 100 mm to 150 mm, and the high-speed jet is maintained for a long time. From the results, the shape of the gas nozzle that supplies $N_2$ gas has devised, and it is found that the contaminants may be further effectively discharged by making the gas nozzle in the shape that is widened in a tapered shape toward the gas port (outlet of the gas nozzle) to increase the gas speed.

As described above, according to the cleaning method according to the embodiment and the substrate processing apparatus that executes the cleaning method, the contaminants adhering to the stage in the vacuum container may be effectively removed.

The cleaning method and the substrate processing apparatus according to the embodiment disclosed here may be considered to be illustrative in all aspects and not restrictive. The above embodiments may be modified and improved in various forms without departing from the scope of the appended claims and the gist. The matters described in the plurality of embodiments may have other configurations within a consistent range, and, additionally, may be combined within a consistent range.

The substrate processing apparatus of the present disclosure may be applied to any type of the apparatus of a capacitively coupled plasma (CCP), an inductively coupled plasma (ICP), a radial line slot antenna (RLSA), an electron cyclotron resonance plasma (ECR), and a helicon wave plasma (HWP).

In the present specification, the wafer W has been described as an example of the substrate. However, the substrate is not limited thereto, and various substrates used for flat panel display (FPD), a printed board, or the like may be used.

The international application claims priority based on Japanese Patent Application No. 2018-132558 filed on Jul. 12, 2018, and the entire disclosure of which is incorporated into this international application.

DESCRIPTION OF SYMBOLS

1: vacuum container
2: rotary table
4: convex portion
5: protruding portion
7: heater unit
10: transfer arm
11: ceiling plate
12: container body
15: transfer port
21: core
24: recess (substrate placing portion)
31: injector
41, 42: injector
55: gas supply pipe
56: gas nozzle
100: film forming apparatus
103: controller
610: first exhaust port
620: second exhaust port
600: exhaust port
640: vacuum pump
SH: shower head
V3: valve

What is claimed is:

1. A cleaning method comprising:
   setting a pressure in a chamber to a predetermined vacuum pressure;
   separating contaminants from a stage in the chamber by supplying a first gas that forms a shock wave from a first gas port of a first gas supply toward the stage, into the chamber at the predetermined vacuum pressure; and
   exhausting the separated contaminants to outside of the chamber by supplying a second gas that does not form the shock wave toward the stage from a second gas supply comprising a first gas nozzle disposed on an outer peripheral side wall of a gas supply pipe provided in a center of the chamber,
   wherein the stage is configured to be rotatable and rotated while performing the supplying the first gas and the supplying the second gas.

2. The cleaning method according to claim 1, wherein, in the supplying the first gas, the first gas is intermittently supplied to form the shock wave.

3. The cleaning method according to claim 1, wherein the supplying the first gas and the supplying the second gas are simultaneously performed.

4. The cleaning method according to claim 1, wherein the supplying the first gas and the supplying the second gas are alternately performed.

5. The cleaning method according to claim 1, wherein the chamber is exhausted while performing the supplying of first gas and the supplying the second gas.

6. The cleaning method according to claim 1, wherein the supplying the first gas is performed after a distance between the first gas supply and the stage is adjusted.

7. The cleaning method according to claim 1, wherein a valve is provided immediately above the chamber to open/close a gas pipe connected to the first gas supply, and
   in the supplying the first gas, the valve is opened to supply the first gas from the gas pipe into the first gas supply.

8. The cleaning method according to claim 1, wherein the second gas supply further comprises a second gas nozzle provided on a side wall of the chamber.

9. The cleaning method according to claim 1, wherein the first gas has an atmospheric pressure or higher.

10. The cleaning method according to claim 1, wherein, in the supplying the first gas, the first gas is supplied in a state where a pressure in a gas pipe connected to the first gas supply and supplying the first gas is five times or more the pressure in the chamber.

11. The cleaning method according to claim 1, wherein the stage includes a plurality of substrate placing portions that holds a plurality of substrates, respectively, and
   the plurality of substrates placed on the substrate placing portions are simultaneously processed while rotating the stage after the cleaning method is performed.

12. The cleaning method according to claim 1, wherein the first gas and the second gas are inert gases.

13. The cleaning method according to claim 8, wherein at least one of the first gas nozzle and the second gas nozzle has a tapered-shape that extends toward a gas port.

14. The cleaning method according to claim 8, wherein, when an angle of a gas hole of at least one of the first gas nozzle and the second gas nozzle which is positioned straightly downward of the gas nozzle is 0°, an angle of the gas hole (θ) is formed at a position satisfying −90°<θ<90° in a circumferential direction.

15. The cleaning method according to claim 8, further comprising:
   exhausting the second gas from one or more exhaust ports provided outside the center of the chamber.

16. The cleaning method according to claim 8, further comprising:
   exhausting the second gas from one or more exhaust ports provided in the center of the chamber or below the stage.

* * * * *